United States Patent
Russo et al.

(10) Patent No.: US 11,593,539 B2
(45) Date of Patent: Feb. 28, 2023

(54) SYSTEMS AND METHODS FOR FACILITATING VIRTUAL VEHICLE OPERATION BASED ON REAL-WORLD VEHICLE OPERATION DATA

(71) Applicant: BLUEOWL, LLC, San Francisco, CA (US)

(72) Inventors: Micah Wind Russo, Oakland, CA (US); Theobolt N. Leung, San Francisco, CA (US); Gareth Finucane, San Francisco, CA (US); Eric Dahl, Newman Lake, WA (US)

(73) Assignee: BlueOwl, LLC, San Francisco, CA (US)

( * ) Notice: Subject to any disclaimer, the term of this patent is extended or adjusted under 35 U.S.C. 154(b) by 909 days.

(21) Appl. No.: 16/206,063

(22) Filed: Nov. 30, 2018

(65) Prior Publication Data

US 2022/0327183 A1 Oct. 13, 2022

(51) Int. Cl.
*G06F 30/20* (2020.01)
*A63F 13/25* (2014.01)
*G05D 1/00* (2006.01)

(52) U.S. Cl.
CPC .............. *G06F 30/20* (2020.01); *A63F 13/25* (2014.09); *G05D 1/0088* (2013.01)

(58) Field of Classification Search
CPC ........ A63F 13/25; G06F 30/27; G05D 1/0088
USPC ............................................................ 703/8
See application file for complete search history.

(56) References Cited

U.S. PATENT DOCUMENTS

| 7,278,920 | B1 | 10/2007 | Klamer et al. |
| 8,645,029 | B2* | 2/2014 | Kim ..................... B60R 16/037 |
| | | | 382/118 |
| 8,799,035 | B2 | 8/2014 | Coleman et al. |
| 9,140,567 | B2* | 9/2015 | Fryer ................ G01C 21/3407 |

(Continued)

FOREIGN PATENT DOCUMENTS

| CN | 105718065 A | 6/2016 |
| CN | 107543554 A | 1/2018 |

(Continued)

OTHER PUBLICATIONS

Lang et al. (Synthesizing Personalized Training Programs for Improving Driving Habits via Virtual Reality, IEEE, 2018, pp. 297-304) (Year: 2018).*

(Continued)

*Primary Examiner* — Iftekhar A Khan
(74) *Attorney, Agent, or Firm* — Faegre Drinker Biddle & Reath LLP

(57) ABSTRACT

Systems and methods for facilitating virtual operation of a virtual vehicle within a virtual environment are disclosed. According to aspects, a computing device may access a data model indicative of real-life operation of a real-life vehicle by a real-life operator and, based on the data model, generate a set of virtual vehicle movements that are reflective of a performance of the real-life operation of the real-life vehicle by the real-life operator. The computing device may display, in a user interface, the virtual vehicle undertaking the set of virtual vehicle movements such that the real-life operator may review the virtual movements and potentially be motivated to improve his/her real-life vehicle operation.

19 Claims, 15 Drawing Sheets

(56) References Cited

U.S. PATENT DOCUMENTS

| | | | |
|---|---|---|---|
| 9,327,189 B2 | 5/2016 | Bavitz et al. | |
| 9,352,216 B2 | 5/2016 | Mullen | |
| 9,373,203 B1 | 6/2016 | Fields et al. | |
| 9,381,426 B1 | 7/2016 | Hughes et al. | |
| 9,473,893 B2* | 10/2016 | Kuramura | H04W 4/025 |
| 9,478,150 B1 | 10/2016 | Fields et al. | |
| 9,586,591 B1 | 3/2017 | Fields et al. | |
| 9,643,089 B2 | 5/2017 | Ishikawa et al. | |
| 9,691,298 B1* | 6/2017 | Hsu-Hoffman | G09B 19/167 |
| 9,754,425 B1 | 9/2017 | Iqbal et al. | |
| 9,786,170 B2 | 10/2017 | Roy et al. | |
| 9,858,832 B1* | 1/2018 | Hsu-Hoffman | G09B 19/167 |
| 9,892,573 B1 | 2/2018 | Hsu et al. | |
| 9,916,693 B1 | 3/2018 | Carr et al. | |
| 9,943,754 B2 | 4/2018 | Prasad et al. | |
| 10,013,883 B2* | 7/2018 | Farnham, IV | G06F 3/04842 |
| 10,055,794 B1* | 8/2018 | Konrardy | G08G 1/096758 |
| 10,086,287 B2 | 10/2018 | Krietzman et al. | |
| 10,127,570 B1 | 11/2018 | Cote et al. | |
| 10,181,238 B2 | 1/2019 | Hate | |
| 10,262,375 B1 | 4/2019 | Howard | |
| 10,282,786 B1 | 5/2019 | Osborne et al. | |
| 10,282,911 B2 | 5/2019 | Carr et al. | |
| 10,360,576 B1 | 7/2019 | Hsu-Hoffman | |
| 10,369,472 B1 | 8/2019 | Mattar et al. | |
| 10,384,130 B2 | 8/2019 | Parisi | |
| 10,403,043 B2 | 9/2019 | Kaufman et al. | |
| 10,430,745 B2 | 10/2019 | Rani et al. | |
| 10,445,758 B1 | 10/2019 | Bryer et al. | |
| 10,521,983 B1* | 12/2019 | Hsu-Hoffman | G06Q 40/08 |
| 10,557,715 B2 | 2/2020 | Caldas et al. | |
| 10,603,591 B1 | 3/2020 | Navulur | |
| 10,617,938 B2 | 4/2020 | Chen et al. | |
| 10,681,181 B2 | 6/2020 | Hamill | |
| 10,703,378 B1 | 7/2020 | Russo et al. | |
| 10,713,543 B1 | 7/2020 | Skuin et al. | |
| 10,723,312 B1 | 7/2020 | Potter et al. | |
| 10,737,184 B2 | 8/2020 | Baszucki | |
| 10,775,179 B1 | 9/2020 | Hayward | |
| 10,782,699 B2* | 9/2020 | Tao | G05D 1/0246 |
| 10,788,332 B2* | 9/2020 | DeLuca | G01C 21/3608 |
| 10,831,207 B1* | 11/2020 | Leung | G05D 1/0088 |
| 10,885,539 B1* | 1/2021 | Purgatorio | B60W 40/09 |
| 10,915,964 B1* | 2/2021 | Purgatorio | G06Q 30/0226 |
| 11,037,382 B2* | 6/2021 | Lei | G05D 1/0088 |
| 2001/0006908 A1 | 7/2001 | Fujioka et al. | |
| 2002/0028704 A1 | 3/2002 | Bloomfield et al. | |
| 2002/0070916 A1 | 6/2002 | Noro et al. | |
| 2002/0075286 A1 | 6/2002 | Yonezawa et al. | |
| 2002/0082068 A1 | 6/2002 | Singhal | |
| 2002/0082082 A1 | 6/2002 | Stamper et al. | |
| 2002/0090985 A1 | 7/2002 | Tochner et al. | |
| 2002/0178033 A1 | 11/2002 | Yoshioka et al. | |
| 2002/0198055 A1 | 12/2002 | Bull et al. | |
| 2003/0062675 A1 | 4/2003 | Noro et al. | |
| 2003/0144047 A1 | 7/2003 | Sprogis | |
| 2003/0224855 A1 | 12/2003 | Cunningham | |
| 2004/0005927 A1 | 1/2004 | Bonilla et al. | |
| 2004/0046655 A1 | 3/2004 | Benes et al. | |
| 2004/0058732 A1 | 3/2004 | Piccionelli | |
| 2004/0248653 A1 | 12/2004 | Barros et al. | |
| 2004/0259059 A1* | 12/2004 | Aoki | A63F 13/5375 463/6 |
| 2005/0009608 A1 | 1/2005 | Robarts et al. | |
| 2005/0049022 A1 | 3/2005 | Mullen | |
| 2006/0105838 A1 | 5/2006 | Mullen | |
| 2006/0154710 A1 | 7/2006 | Serafat | |
| 2006/0258420 A1 | 11/2006 | Mullen | |
| 2007/0257804 A1 | 11/2007 | Gunderson et al. | |
| 2007/0281765 A1 | 12/2007 | Mullen | |
| 2007/0281766 A1 | 12/2007 | Mullen | |
| 2008/0015018 A1 | 1/2008 | Mullen | |
| 2008/0015024 A1 | 1/2008 | Mullen | |
| 2008/0081694 A1 | 4/2008 | Hong et al. | |
| 2008/0280684 A1 | 11/2008 | McBride et al. | |
| 2008/0309675 A1 | 12/2008 | Fleury et al. | |
| 2009/0005140 A1 | 1/2009 | Rose et al. | |
| 2010/0205012 A1 | 8/2010 | McClellan | |
| 2011/0090075 A1 | 4/2011 | Armitage et al. | |
| 2011/0212766 A1 | 9/2011 | Bowers et al. | |
| 2012/0052953 A1 | 3/2012 | Annambhotla et al. | |
| 2012/0069131 A1 | 3/2012 | Abelow | |
| 2012/0072241 A1 | 3/2012 | Krause et al. | |
| 2012/0185282 A1 | 7/2012 | Gore et al. | |
| 2013/0090821 A1 | 4/2013 | Abboud et al. | |
| 2013/0164715 A1 | 6/2013 | Hunt et al. | |
| 2013/0268156 A1* | 10/2013 | Schumann | G07C 5/085 701/31.4 |
| 2013/0311250 A1 | 11/2013 | Hickethier et al. | |
| 2014/0125678 A1 | 5/2014 | Wang et al. | |
| 2014/0129130 A1 | 5/2014 | Kuramura et al. | |
| 2014/0195106 A1 | 7/2014 | McQuade et al. | |
| 2014/0195272 A1* | 7/2014 | Sadiq | G06Q 40/08 705/4 |
| 2014/0322674 A1* | 10/2014 | Livneh | G09B 9/40 434/30 |
| 2014/0322676 A1 | 10/2014 | Raman | |
| 2014/0364238 A1 | 12/2014 | Koh et al. | |
| 2015/0011315 A1 | 1/2015 | Sofman et al. | |
| 2015/0081404 A1* | 3/2015 | Basir | G06Q 30/08 705/14.1 |
| 2015/0093722 A1* | 4/2015 | Fitzgerald | G09B 9/04 434/62 |
| 2015/0112504 A1 | 4/2015 | Binion et al. | |
| 2015/0178998 A1 | 6/2015 | Attard et al. | |
| 2015/0187224 A1* | 7/2015 | Moncrief | G09B 9/052 434/30 |
| 2015/0212722 A1 | 7/2015 | Leung et al. | |
| 2015/0294422 A1 | 10/2015 | Carver et al. | |
| 2015/0310758 A1 | 10/2015 | Daddona et al. | |
| 2016/0003636 A1 | 1/2016 | Ng-Thow-Hing et al. | |
| 2016/0003836 A1 | 1/2016 | Stauber et al. | |
| 2016/0084661 A1* | 3/2016 | Gautama | G01C 21/26 701/400 |
| 2016/0219024 A1 | 7/2016 | Verzun et al. | |
| 2016/0371553 A1 | 12/2016 | Farnham et al. | |
| 2017/0061733 A1 | 3/2017 | Gulla et al. | |
| 2017/0089710 A1 | 3/2017 | Slusar | |
| 2017/0323244 A1* | 11/2017 | Rani | G07C 5/02 |
| 2018/0247558 A1* | 8/2018 | Livneh | G09B 9/24 |
| 2018/0286268 A1* | 10/2018 | Ni | G02B 27/017 |
| 2018/0322700 A1 | 11/2018 | Carr et al. | |
| 2018/0350144 A1 | 12/2018 | Rathod | |
| 2019/0096134 A1 | 3/2019 | Amacker et al. | |
| 2019/0108768 A1* | 4/2019 | Mohamed | G09B 19/14 |
| 2019/0113927 A1* | 4/2019 | Englard | G06N 3/006 |
| 2019/0265703 A1 | 8/2019 | Hicok et al. | |
| 2019/0384292 A1* | 12/2019 | Aragon | B60W 40/09 |
| 2020/0013306 A1 | 1/2020 | McQuade et al. | |
| 2020/0050719 A1* | 2/2020 | Fuerstenberg | G05D 1/0088 |
| 2020/0074266 A1* | 3/2020 | Peake | G06V 10/774 |
| 2020/0104326 A1 | 4/2020 | Ricci | |
| 2020/0139250 A1 | 5/2020 | Curtis et al. | |
| 2020/0286253 A1* | 9/2020 | Chilcote-Bacco | G06T 19/006 |
| 2020/0334762 A1* | 10/2020 | Carver | G06Q 40/08 |
| 2020/0357075 A1 | 11/2020 | Dahl | |
| 2020/0391104 A1 | 12/2020 | Nakamura et al. | |
| 2021/0049925 A1* | 2/2021 | Robinson | G09B 9/206 |
| 2021/0232632 A1* | 7/2021 | Howard | G06F 16/335 |
| 2022/0242450 A1 | 8/2022 | Sokolov et al. | |
| 2022/0284077 A1* | 9/2022 | Dahl | G06F 30/20 |

FOREIGN PATENT DOCUMENTS

| | | |
|---|---|---|
| CN | 108253982 A | 7/2018 |
| CN | 108334090 A | 7/2018 |
| CN | 108446027 A | 8/2018 |
| CN | 109491394 A | 3/2019 |
| CN | 110427682 A | 11/2019 |
| CN | 210021183 U | 2/2020 |
| DE | 102013213179 A1 | 1/2015 |
| DE | 102018122864 A1 | 3/2020 |
| DE | 102019205083 A1 | 10/2020 |

(56) References Cited

FOREIGN PATENT DOCUMENTS

| JP | 2014-181927 A | 9/2014 |
| KR | 10-2013-0107481 A | 10/2013 |
| WO | 2016/148753 A1 | 9/2016 |
| WO | 2019/245578 A1 | 12/2019 |
| WO | 2020/172634 A1 | 8/2020 |
| WO | 2020/181001 A1 | 9/2020 |

OTHER PUBLICATIONS

Vibhor Rastogi (Virtual Reality Based Simulation Testbed for Evaluation of Autonomous Vehicle Behavior Algorithms, Clemson University, 2017, pp. 1-69) (Year: 2017).*

Ali et al., "Virtual Environment for Automobile Driving Test", In 2018 International Conference on Computing Sciences and Engineering (ICCSE), Mar. 2018, pp. 1-6.

Avouris et al., "A review of mobile location-based games for learning across physical and virtual spaces", J. UCS, vol. 18, No. 15, 2012, pp. 2120-2142.

Bozorgi et al., "A Time and Energy Efficient Routing Algorithm for Electric Vehicles Based on Historical Driving Data", IEEE Transactions on Intelligent Vehicles, vol. 2, No. 4, 2017, pp.

Bui et al., "The Effects of Gamification on Driver Behavior: An Example from a Free Float Carsharing Service", 2015.

Culík et al., "Creating a Virtual Environment for Practical Driving Tests", In International Conference on Transport Systems Telematics, 2019, pp. 95-108.

Dooren et al., "Rewards That Make You Play: the Distinct Effect of Monetary Rewards, Virtual Points and Social Rewards on Play Persistence in Substance Dependent and Non-Dependent Adolescents", In 2018 IEEE 6th International Conference on Serious Games and Applications for Health (SeGAH), May 2018, pp. pp. 1-7.

Esser et al., "Towards learning a realistic rendering of human behavior", In Proceedings of the European Conference on Computer Vision (ECCV), 2018, (pp. 0-0).

Handel et al., "Insurance telematics: Opportunities and challenges with the smartphone solution", IEEE Intelligent Transportation Systems Magazine, vol. 6, No. 4, 2014, pp. 57-70.

Helvaci et al., "Improving Driver Behavior Using Gamication", In International Conference on Mobile Web and Intelligent Information Systems, Aug. 2018, pp. 193-204.

Herrtwich et al., "Cooperative Driving: Taking Telematics to the Next Level", In Traffic and Granular Flow'01, 2003, pp. 271-280.

International Search Report and Written Opinion received for PCT Patent Application No. PCT/US2021/013911, dated Mar. 31, 2021, 9 pages.

International Search Report and Written Opinion received for PCT Patent Application No. PCT/US2021/013918, dated Apr. 8, 2021, 10 pages.

International Search Report and Written Opinion received for PCT Patent Application No. PCT/US2021/013928, dated Apr. 2, 2021, 8 pages.

International Search Report and Written Opinion received for PCT Patent Application No. PCT/US2021/013930, dated Apr. 23, 2021, 12 pages.

Lang et al., "Synthesizing Personalized Training Programs for Improving Driving Habits via Virtual Reality", In 2018 IEEE Conference on Virtual Reality and 3D User Interfaces, Mar. 2018, pp. 297-304.

Liu et al., "Two Techniques for Assessing Virtual Agent Personality", IEEE Transactions on Affective Computing, vol. 7, No. 1, May 19, 2015, pp. 94-105.

Lopez et al., "Using pervasive games as learning tools in educational contexts: a systematic review", International Journal of Learning Technology, vol. 13, No. 2, 2018, pp. 93-114.

Richter et al., "Studying Gamification: The Effect of Rewards and Incentives on Motivation", In Gamification in education and business, 2015, pp. 21-46.

Sha et al., "Social vehicle navigation: integrating shared driving experience into vehicle navigation", In Proceedings of the 14th workshop on mobile computing systems and applications, Feb. 2013, pp. 1-6.

Singh et al., "Real-time Collaboration Between Mixed Reality Users in Geo-referenced Virtual Environment", arXiv preprint arXiv, 2020, 2010.01023.

Stojaspal, Jan., "Gamification and telematics", available online at https://www.tu-auto.com/gamification-and-telematics/, 2013, 6 pages.

Wilken et al., "Maps and the Autonomous Vehicle as a Communication Platform", International Journal of Communication, vol. 13, 20'19, pp. 2703-2727.

wiki.sc4devotion.com, SimCity 4 Encyclopaedia, "Tutorial: Understanding the Traffic Simulator", pp. 1-15. Retrieved from the Internet on Aug. 14, 2019: https://www.wiki.sc4devotion.com/index.php?title=Understanding_the_Traffic_Simulator.

"Drive Safe, Score Well: App Is a Driving 'Report Card'," by Lynn Jolicoeur and Sacha Pfeiffer, published Oct. 9, 2014. Source: https://www.wbur.org/news/2014/10/09/safe-driving-app (Year: 2014).

"UK Telematics Online. Submitted articles relating to Vehicle Telematics," published Aug. 31, 2009. Source: https://web.archive.org/web/20090831075032/http://www.uktelematicsonline.co.uk/html/telematics_articles.html (Year: 2009).

* cited by examiner

SYSTEMS AND METHODS FOR FACILITATING VIRTUAL VEHICLE OPERATION BASED ON REAL-WORLD VEHICLE OPERATION DATA

FIELD OF THE DISCLOSURE

The present disclosure is directed to managing virtual vehicle operation in a virtual environment. In particular, the present disclosure is directed to systems and methods for facilitating virtual vehicle operation based on a data model indicative of real-world vehicle operation by a vehicle operator.

BACKGROUND

Individuals frequently operate or otherwise travel in vehicles, where vehicular safety is consistently of paramount importance. Vehicle manufacturers regularly incorporate new technologies, and government agencies implement safety measures intended to reduce vehicular accidents and generally increase vehicular safety. This combination of technologies and safety measures have improved vehicular safety over a period of years.

Individuals generally exercise care while operating vehicles, of course. However, because vehicular accidents are relatively rare, it may be psychologically difficult for many vehicle operators to appreciate the risks that vehicular operation still pose, and the vehicle operators may not be readily mindful of or accepting of reducing these risks. In other words, any efforts to incrementally improve vehicular safety may be readily disregarded by vehicle operators.

Accordingly, there is an opportunity for technologies directed to increasing vehicular safety by increasing a vehicle operator's appreciation and awareness of risks posed by vehicle operation.

SUMMARY

In an embodiment, a computer-implemented method of modeling vehicle operating behavior in a virtual environment is provided. The method may include: accessing, from a memory, a data model indicative of vehicle operating behavior previously conducted by an operator of a vehicle; initiating, by a processor in the virtual environment, a virtual trip of a virtual vehicle operated by a virtual operator; and conducting, by the processor, the virtual trip, including: determining, based at least in part on the data model, a set of virtual vehicle movements for the virtual vehicle to undertake in the virtual trip, and displaying, in a user interface, visual data indicative of the set of virtual vehicle movements for review by the operator of the vehicle.

In another embodiment, a system for modeling vehicle operating behavior in a virtual environment is provided. The system may include a user interface, a memory storing (i) a data model indicative of vehicle operating behavior previously conducted by an operator of a vehicle, and (ii) a set of computer-executable instructions, and a processor communicatively coupled to the user interface and the memory. The processor is configured to execute the computer-executable instructions to cause the processor to: access the data model from the memory, initiate, in the virtual environment, a virtual trip of a virtual vehicle operated by a virtual operator, and conduct the virtual trip, including: determine, based at least in part on the data model, a set of virtual vehicle movements for the virtual vehicle to undertake in the virtual trip, and cause the user interface to display visual data indicative of the set of virtual vehicle movements for review by the operator of the vehicle.

BRIEF DESCRIPTION OF THE DRAWINGS

The figures described below depict various aspects of the system and methods disclosed herein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

Figure 1:
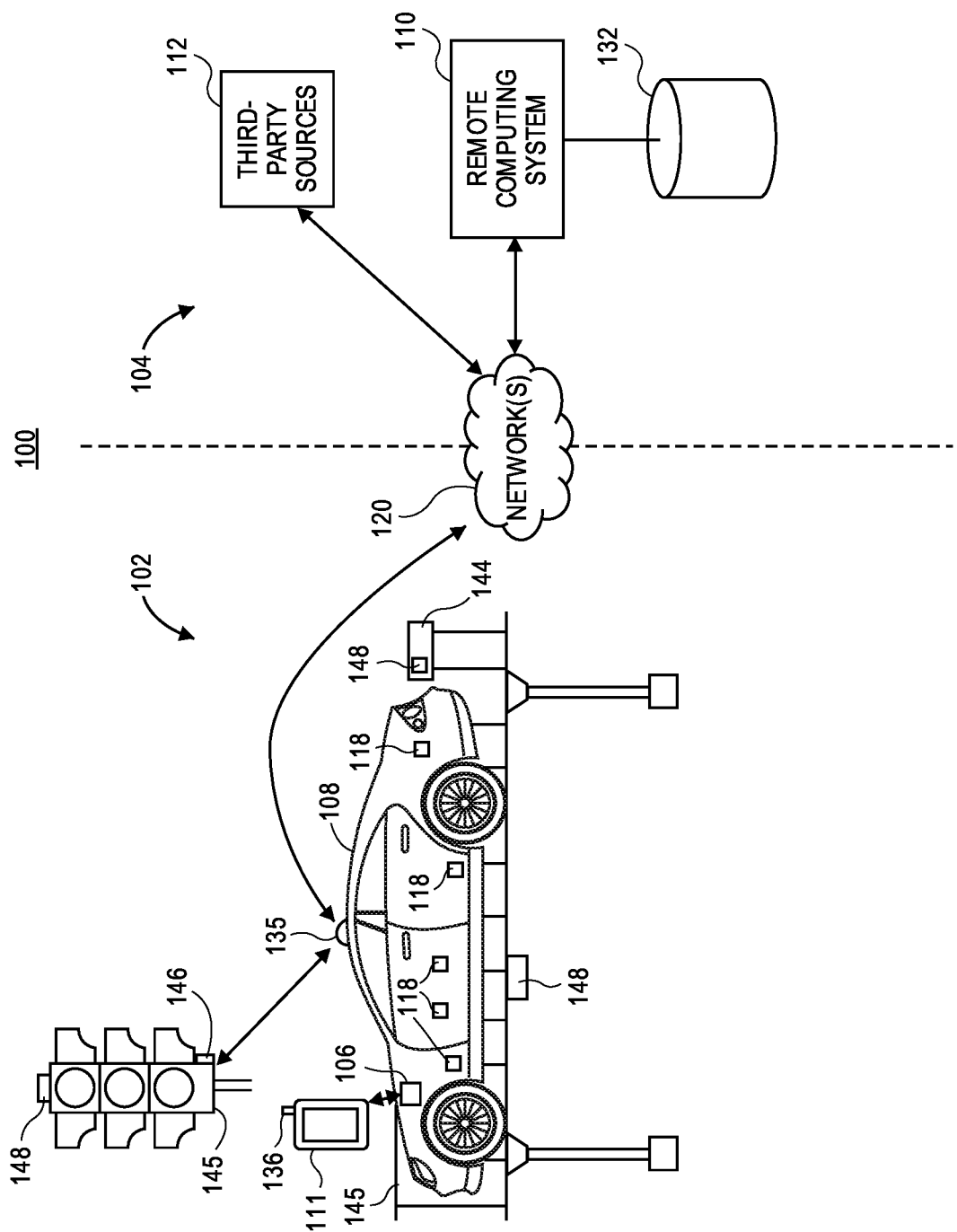
FIG. 1 depicts an overview of components and entities associated with the systems and methods, in accordance with some embodiments.

The figures depict various aspects of the present invention for purposes of illustration only. One skilled in the art will readily recognize from the following discussion that alternative embodiments of the structures and methods illustrated herein may be employed without departing from the principles of the invention described herein.

DETAILED DESCRIPTION

The present embodiments may relate to, inter alia, facilitating virtual operation of virtual vehicles within a virtual environment based on real-world vehicle operation data. The present embodiments may further relate to presenting the virtual operation of the virtual vehicles in a user interface for review by real-life operators of real-life vehicles.

According to certain aspects, systems and methods may generate a data model representative of real-life operation of a real-life vehicle by a real-life operator, where the data model may include various performance characteristics and metrics. The systems and methods may access the data model and, based on the data model, may determine operation of a virtual vehicle within a virtual environment, where the operation may include a set of virtual movements or maneuvers for the virtual vehicle to undertake within the virtual environment.

Additionally, the systems and methods may display, in a user interface, a visual representation of the virtual operation of the virtual vehicle for review by the real-life operator. The systems and methods may continuously update the virtual operation based on updated real-life vehicle operation data. In some scenarios, the real-life operator may recognize certain limitations and areas for improvement in the virtual operation of the virtual vehicle. Because the virtual operation of the virtual vehicle is based on the real-life operation of the real-life vehicle, the real-life operator may be motivated to modify or adjust his/her real-life vehicle operation in order to correct or address the limitations and areas for improvement identified in the virtual operation of the virtual vehicle.

The systems and methods therefore offer numerous benefits. In particular, by incorporating virtual vehicle operation that mirrors real-world vehicle operation, the systems and methods may effectively penetrate psychological barriers that vehicle operators possess in decreasing the perceived low risks associated with vehicle operation. Accordingly, vehicular safety may improve, thereby increasing the safety of vehicle operators and those otherwise affected by vehicle operation.

The embodiments as discussed herein describe virtual vehicle operation and real-life vehicle operation. It should be appreciated that the term "virtual" describes simulated features, components, individuals, and the like, that do not physically exist, have not physically occurred, or are not physically occurring in the real-world environment, but is rather made by software and hardware components to appear to physically exist. Further, it should be appreciated that the term "real-life" or "real-world" (or, in some cases, components without mention of the term "virtual"), in contrast, describes actual features, components, individuals, and the like, that do physically exist, have physically occurred, or are physically occurring in the real-world environment. In some embodiments, the virtual vehicle operation may be at least partially embodied in augmented reality, wherein virtual display data may be overlaid on real-world image data.

FIG. 1 illustrates an overview of a system 100 of components configured to facilitate the systems and methods. Generally, the system 100 may include both hardware components and software applications that may execute on the hardware components, as well as various data communications channels for communicating data between and among the various components. It should be appreciated that the system 100 is merely an example and that alternative or additional components are envisioned.

As illustrated in FIG. 1, the system 100 may be segmented into a set of front-end components 102 and a set of back-end components 104. The front-end components 102 may include a vehicle 108 which may be, for example, an automobile, car, truck, tow truck, snowplow, boat, motorcycle, motorbike, scooter, recreational vehicle, or any other type of vehicle capable of roadway or water travel. According to embodiments, the vehicle 108 may be capable of operation by a vehicle operator, and may be capable of at least partial (or total) autonomous operation by a computer 106 via the collection and analysis of various sensor data. Although FIG. 1 depicts the single vehicle 108, it should be appreciated that additional vehicles are envisioned.

The computer 106 may be may be permanently or removably installed in the vehicle 108, and may generally be an on-board computing device capable of performing various functionalities relating to analyzing vehicle operation data and facilitating virtual vehicle operation (and, in some cases, at least partial autonomous vehicle operation). Thus, the computer 106 may be particularly configured with particular elements to thereby be able to perform functions relating to these functionalities. Further, the computer 106 may be installed by the manufacturer of the vehicle 108, or as an aftermarket modification or addition to the vehicle 108. In FIG. 1, although only one computer 106 is depicted, it should be understood that in some embodiments, a plurality of computers 106 (which may be installed at one or more locations within the vehicle 108) may be used.

The system 100 may further include an electronic device 111 that may be associated with the vehicle 108, where the electronic device 111 may be any type of electronic device such as a mobile device (e.g., a smartphone), notebook computer, tablet, phablet, GPS (Global Positioning System) or GPS-enabled device, smart watch, smart glasses, smart bracelet, wearable electronic, PDA (personal digital assistants), pager, computing device configured for wireless communication, and/or the like. The electronic device 111 may be equipped or configured with a set of sensors, such as a location module (e.g., a GPS chip), an image sensor, an accelerometer, a clock, a gyroscope, a compass, a yaw rate sensor, a tilt sensor, and/or other sensors.

The electronic device 111 may belong to or be otherwise associated with an individual, where the individual may be an operator of the vehicle 108 or otherwise associated with the vehicle 108. For example, the individual may own the vehicle 108, may rent the vehicle 108 for a variable or allotted time period, or may operate vehicle 108 as part of a ride share. According to embodiments, the individual may carry or otherwise have possession of the electronic device 111 during operation of the vehicle 108.

In some embodiments, the computer 106 may operate in conjunction with the electronic device 111 to perform any or all of the functions described herein as being performed by the vehicle 108. In other embodiments, the computer 106 may perform all of the functionalities described herein, in which case the electronic device 111 may not be present or may not be connected to the computer 106. In still other embodiments, the electronic device 111 may perform all of the functionalities described herein. Still further, in some embodiments, the computer 106 and/or the electronic device 111 may perform any or all of the functions described herein in conjunction with one or more of the back-end components 104. For example, in some embodiments or under certain conditions, the electronic device 111 and/or the computer 106 may function as thin-client devices that outsource some or most of the processing to one or more of the back-end components 104.

The computer 106 and/or the electronic device 111 may communicatively interface with one or more on-board sensors 118 that are disposed on or within the vehicle 108 and that may be utilized to monitor the vehicle 108 and the environment in which the vehicle 108 is operating. In particular, the one or more on-board sensors 118 may sense conditions associated with the vehicle 108 and/or associated with the environment in which the vehicle 108 is operating, and may generate sensor data indicative of the sensed conditions. For example, the sensor data may include a location and/or operation data indicative of operation of the vehicle 108. In some configurations, at least some of the on-board sensors 118 may be fixedly disposed at various locations on the vehicle 108. Additionally or alternatively, at least some of the on-board sensors 118 may be incorporated within or connected to the computer 106. Still additionally or alternatively, in some configurations, at least some of the on-board sensors 118 may be included on or within the electronic device 111.

The on-board sensors 118 may communicate respective sensor data to the computer 106 and/or to the electronic device 111, and the sensor data may be processed using the computer 106 and/or the electronic device 111 to determine when the vehicle 108 is in operation as well as determine information regarding operation of the vehicle 108. In some situations, the on-board sensors 118 may communicate respective sensor data indicative of the environment in which the vehicle 108 is operating.

According to embodiments, the sensors 118 may include one or more of a GPS unit, a radar unit, a LIDAR unit, an ultrasonic sensor, an infrared sensor, some other type of electromagnetic energy sensor, a microphone, a radio (e.g., to support wireless emergency alerts or an emergency alert system), an inductance sensor, a camera, an accelerometer, an odometer, a system clock, a gyroscope, a compass, a geo-location or geo-positioning unit, a location tracking sensor, a proximity sensor, a tachometer, a speedometer, and/or the like. Some of the on-board sensors 118 (e.g., GPS, accelerometer, or tachometer units) may provide sensor data indicative of, for example, the vehicle's 108 location, speed, position acceleration, direction, responsiveness to controls, movement, etc.

Other sensors 118 may be directed to the interior or passenger compartment of the vehicle 108, such as cameras, microphones, pressure sensors, weight sensors, thermometers, or similar sensors to monitor any passengers, operations of instruments included in the vehicle 108, operational behaviors of the vehicle 108, and/or conditions within the vehicle 108. For example, on-board sensors 118 directed to the interior of the vehicle 108 may provide sensor data indicative of, for example, in-cabin temperatures, in-cabin noise levels, data from seat sensors (e.g., indicative of whether or not an individual is using a seat, and thus the number of passengers being transported by the vehicle 108), data from seat belt sensors, data regarding the operations of user controlled devices such as windshield wipers, defrosters, traction control, mirror adjustment, interactions with on-board user interfaces, etc. Additionally, the on-board sensors 118 may further detect and monitor the health of the occupant(s) of the vehicle 108 (e.g., blood pressure, heart rate, blood sugar, temperature, etc.). Moreover, the on-board sensors 118 may additionally detect various criminal acts, including auto thefts, car jackings, and/or the like. In these scenarios, the vehicle 108 may initiate communications to relevant responders (e.g., a police station) of the detected act(s).

Some of the sensors 118 disposed at the vehicle 108 (e.g., radar, LIDAR, camera, or other types of units that operate by using electromagnetic energy) may actively or passively scan the environment external to the vehicle 108 for obstacles (e.g., emergency vehicles, other vehicles, buildings, pedestrians, trees, gates, barriers, animals, etc.) and their movement, weather conditions (e.g., precipitation, wind, visibility, or temperature), roadways, road conditions (e.g., lane markings, potholes, road material, traction, or slope), road topography, traffic conditions (e.g., traffic density, traffic congestion, etc.), signs or signals (e.g., traffic signals, speed limits, other jurisdictional signage, construction signs, building signs or numbers, or control gates), and/or other information indicative of the environment of the vehicle 108. Information or data that is generated or received by the on-board sensors 118 may be communicated to the computer 106 and/or to the electronic device 111.

In some embodiments of the system 100, the front-end components 102 may communicate collected sensor data to the back-end components 104 (e.g., via a network(s) 120). In particular, at least one of the computer 106 and the electronic device 111 may communicate with the back-end components 104 via the network(s) 120 to enable the back-end components 104 to record collected sensor data and information regarding vehicle operation.

The network(s) 120 may include a proprietary network, a secure public internet, a virtual private network, and/or some other type of network, such as dedicated access lines, plain ordinary telephone lines, satellite links, cellular data networks, combinations of these and/or other types of networks. The network(s) 120 may utilize one or more radio frequency communication links to communicatively connect to the vehicle 108, e.g., utilize wireless communication link(s) to communicatively connect with the electronic device 111 and the computer 106. Where the network(s) 120 comprises the Internet or other data packet network, data communications may take place over the network(s) 120 via an Internet or other suitable data packet communication protocol. In some arrangements, the network(s) 120 additionally or alternatively includes one or more wired communication links or networks.

The back-end components 104 include one or more servers or computing devices, which may be implemented as a server bank or cloud computing system 110, and is interchangeably referred to herein as a "remote computing system 110." The remote computing system 110 may include one or more computer processors adapted and configured to execute various software applications and components of the system 100, in addition to other software applications.

The remote computing system 110 may further include or be communicatively connected to one or more data storage devices or entities 132, which may be adapted to store data related to the operation of the vehicle 108, the environment and context in which the vehicle 108 is operating, and/or other information. For example, the one or more data storage devices 132 may be implemented as a data bank or a cloud data storage system, at least a portion of which may be locally accessed by the remote computing system 110 using a local access mechanism such as a function call or database access mechanism, and/or at least a portion of which may be remotely accessed by the remote computing system 110 using a remote access mechanism such as a communication protocol. The remote computing system 110 may access data stored in the one or more data storage devices 132 when executing various functions and tasks associated with the present disclosure.

The back-end components 104 may further include a set of third-party sources 112, which may be any system, entity, repository, or the like, capable of obtaining and storing data that may be indicative of situations and circumstances associated with vehicle operation, or data associated with the operator of the vehicle 108. For example, one of the third-party sources 112 may be a social network provider storing a set of contacts or connections associated with the operator of the vehicle 108. Although FIG. 1 depicts the set of third-party sources 112 as separate from the one or more data storage devices 132, it should be appreciated that the set of third-party sources 112 may be included as part of the one or more data storage devices 132. In embodiments, the third-party source(s) 112 may store data indicative of vehicle operation regulations. For example, the third-party source 112 may store speed limit information, direction of travel information, lane information, and/or similar information. The third-party source(s) 112 may also maintain or obtain real-time data indicative of traffic signals for roadways (e.g., which traffic signals currently have red lights or green lights). It should be appreciated that the one or more data storage devices or entities 132 may additionally or alternatively store the data indicative of vehicle operation regulations.

To communicate with the remote computing system 110 and other portions of the back-end components 104, the front-end components 102 may include a communication component(s) 135, 136 that are configured to transmit information to and receive information from the back-end components 104 and, in some embodiments, transmit information to and receive information from other external sources, such as emergency vehicles, other vehicles and/or infrastructure or environmental components disposed within the environment of the vehicle 108. The communication components 135, 136 may include one or more wireless transmitters or transceivers operating at any desired or suitable frequency or frequencies.

Different wireless transmitters or transceivers may operate at different frequencies and/or by using different protocols, if desired. In an example, the electronic device 111 may include a respective communication component 136 for sending or receiving information to and from the remote computing system 110 via the network(s) 120, such as over one or more radio frequency links or wireless communication channels which support a first communication protocol (e.g., GSM, CDMA, LTE, one or more IEEE 802.11 Standards such as Wi-Fi, WiMAX, BLUETOOTH, etc.). Additionally or alternatively, the computer 106 may operate in conjunction with an on-board transceiver or transmitter 135 that is disposed at the vehicle 108 (which may, for example, be fixedly attached to the vehicle 108) for sending or receiving information to and from the remote computing system 110 via the network(s) 120, such as over one or more radio frequency links or wireless communication channels which support the first communication protocol and/or a second communication protocol.

In some embodiments, the computer 106 may operate in conjunction with the electronic device 111 to utilize the communication component 136 of the electronic device 111 to deliver information to the back-end components 104. In some embodiments, the computer 106 may operate in conjunction with the electronic device 111 to utilize the communication component 135 of the vehicle 108 to deliver information to the back-end components 104. In some embodiments, the communication components 135, 136 and their respective links may be utilized by the computer 106 and/or the electronic device 111 to communicate with the back-end components 104.

Accordingly, either one or both of the electronic device 111 or the computer 106 may communicate with the network(s) 120 over the link(s). Additionally, in some configurations, the electronic device 111 and the computer 106 may communicate with one another directly over a wireless or wired link.

In some embodiments of the system 100, the computer 106 and/or the electronic device 111 of the vehicle 108 may communicate with respective on-board computers and/or electronic devices disposed at an additional vehicle(s) (e.g., emergency vehicles, other autonomous vehicles, or other vehicles), either directly or via the network(s) 120. For example, the computer 106 and/or the electronic device 111 disposed at the vehicle 108 may communicate with respective on-board computers and/or mobile devices of the additional vehicle(s) via the network(s) 120 and the communication component(s) 135, 136 by using one or more suitable wireless communication protocols (e.g., GSM, CDMA, LTE, one or more IEEE 802.11 Standards such as Wi-Fi, WiMAX, BLUETOOTH, etc.). In some configurations, the computer 106 may directly communicate with the additional vehicle(s) in a peer-to-peer (P2P) manner, which may utilize, for example, a Wi-Fi direct protocol, a BLUETOOTH or other short range communication protocol, an ad-hoc cellular communication protocol, or any other suitable wireless communication protocol.

In some embodiments, the system 100 may include one or more environmental communication components or devices, examples of which are depicted in FIG. 1 by references 144 and 146, that may be used for monitoring the status of one or more infrastructure components 145 and/or for receiving data generated by other sensors 148 that may be associated with, or may detect or be detected by, the vehicle 108 and disposed at locations that are off-board the vehicle 108. As generally referred to herein, with respect to the vehicle 108, "off-board sensors" or "environmental sensors" 148 are sensors that are not transported by the vehicle 108. The data collected by the off-board sensors 148 is generally referred to herein as "sensor data," "off-board sensor data," or "environmental sensor data" with respect to the vehicle 108.

At least some of the off-board sensors 148 may be disposed on or at the one or more infrastructure components 145 or other types of components that are fixedly disposed within the environment in which the vehicle 108 is traveling. Infrastructure components 145 may include roadways, bridges, traffic signals, gates, switches, crossings, parking lots or garages, toll booths, docks, hangars, or other similar physical portions of a transportation system's infrastructure, for example. Other types of infrastructure components 145 at which off-board sensors 148 may be disposed may include a traffic light, a street sign, a railroad crossing signal, a construction notification sign, a roadside display configured to display messages, a billboard display, a parking garage monitoring device, etc. Off-board sensors 148 that are disposed on or near infrastructure components 145 may generate data relating to the presence and location of obstacles or of the infrastructure component 145 itself, weather conditions, traffic conditions, operating status of the infrastructure component 145, and/or behaviors of various vehicles 108, 109, pedestrians, and/or other moving objects within the vicinity of the infrastructure component 145, for example.

Additionally or alternatively, at least some of the off-board sensors 148 that are communicatively connected to the one or more infrastructure devices 145 may be disposed on or at one or more other vehicle(s) 109 operating in the vicinity of the vehicle 108. As such, a particular sensor that is disposed on-board the additional vehicle 109 may be viewed as an off-board sensor 148 with respect to the vehicle 108.

The one or more environmental communication devices 144, 146 may be communicatively connected (either directly or indirectly) to the one or more off-board sensors 148, and thereby may receive information relating to the condition and/or location of the infrastructure components 145, of the environment surrounding the infrastructure components 145, and/or of the other vehicle(s) 109 or objects within the environment of the vehicle 108. In some embodiments, the one or more environmental communication devices 144, 146 may receive information from the vehicle 108, while, in other embodiments, the environmental communication device(s) 144, 146 may transmit information to the vehicle 108.

As previously discussed, at least some of the environmental communication devices 144, 146 may be locally disposed in the environment in which the vehicle 108 is operating. In some embodiments, at least some of the environmental communication devices 144, 146 may be remotely disposed, e.g., at the back-end 104 of the system 100. In some embodiments, at least a portion of the environmental communication devices 144, 146 may be included in (e.g., integral with) one or more off-board sensors 148. In some configurations, at least some of the environmental communication devices 144, 146 may be included or integrated into the one or more on-board communication components 135, 136, the computer 106, the electronic device 111, and/or the additional vehicle(s) 109 or components thereof.

According to embodiments, the computer 106 and/or the electronic device 111 may retrieve or otherwise access data from any combination of the sensors 118, 148, where the data is generated during real-world operation of the vehicle 108 by the operator. The computer 106 and/or the electronic device 111 may generate a data model that is representative of the real-world operation of the vehicle 108 by the operator, where the data model may include data related to performance characteristics associated with the real-world operation.

Additionally, the computer 106 and/or the electronic device 111 may facilitate virtual operation of a virtual vehicle by a virtual operator within a virtual environment. In particular, the virtual operation may be based on the data model representative of the real-world operation of the vehicle 108. According to embodiments, either or both of the computer 106 and the electronic device 111 may be configured with a user interface configured to present or display content. The computer 106 and/or the electronic device 111 may cause the user interface(s) to display or present the virtual environment, and depict the virtual operation of the virtual vehicle by the virtual operator within the virtual environment. Additionally, the user interface(s) may present statistics, data, and other information associated with the virtual operation of the virtual vehicle for review by the operator of the vehicle 108.

Figure 2:
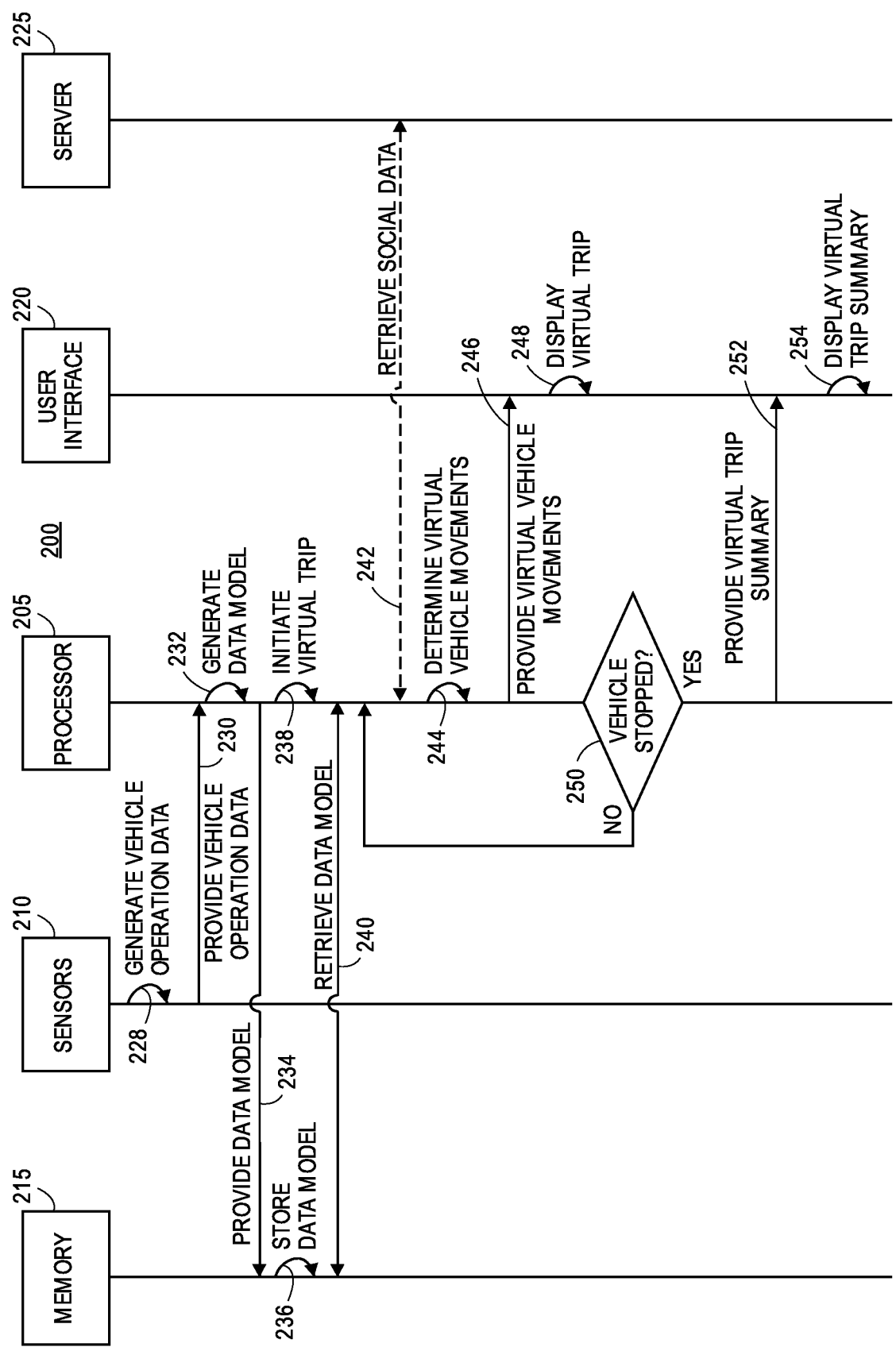
FIG. 2 is an example signal diagram associated with facilitating virtual operation of a virtual vehicle in a virtual environment, in accordance with some embodiments.

FIG. 2 depicts a signal diagram 200 associated with managing virtual trips within a virtual environment based on real-life operation data of a real-life vehicle operated by a real-life operator. The signal diagram 200 includes a memory 215, a set of sensors 210 (such as any of the sensors 118, 148 as discussed with respect to FIG. 1), a processor 205, a user interface 220, and a server 225 (such as a server associated with the remote computing system 110 as discussed with respect to FIG. 1). According to embodiments, the processor 205 and the user interface 220 may be embodied within an electronic device associated with a vehicle (such as the computer 106 and/or the electronic device 111 as discussed with respect to FIG. 1); and the set or sensors 210 may be disposed on, throughout, or within various portions of the vehicle.

The signal diagram 200 may begin when the set of sensors 210 generates (228) a set of vehicle operation data that reflects operation of the vehicle by the operator. It should be appreciated that the set of vehicle operation data may be generated by any combination of the set of sensors 210. Additionally, the set of sensors 210 may generate the set of vehicle operation data continuously or over the course of one or more time periods. The set of sensors 210 may provide (230) the set of vehicle operation data to the processor 205, such as in real-time or near-real-time as the set of sensors 210 generates the set of vehicle operation data.

The processor 205 may generate (232) a data model based on at least a portion of the set of vehicle operation data, where the data model may generally represent operation of the vehicle by the operator. In an embodiment, the data model may reflect the following vehicle operation or performance characteristics: acceleration, braking, and/or steering (although alternative and additional characteristics are envisioned), where each characteristic may have a relative performance associated therewith. For example, each vehicle operation characteristic in the data model may have a number rating on a scale from one (1) to ten (10).

It should be appreciated that the processor 205 may generate the data model according to various data analysis techniques, calculations, algorithms, and/or the like. Generally, the data analysis techniques process and analyze the raw sensor data and generate a set of information (e.g., structured information) from which vehicle operation metrics may be identified or determined. For example, the processor 205 may process raw angular and linear acceleration data, and may generate, for the data model, metrics corresponding to the acceleration, braking, and steering performance of the vehicle operator.

After generating the data model, the processor 205 may provide (234) the data model to the memory 215. Subsequently, the memory 215 may store (236) the data model. Although not depicted in FIG. 2, it should be appreciated that the set of sensors 210, the processor 205, and the memory 215 may repeat the functionalities of (228), (230), (232), (234), and (236) continuously or at distinct periods of time. Thus, when the processor 205 accesses the data model from the memory 215, the data model may be an up-to-date representation of the operation of the vehicle by the operator.

The processor 205 may initiate (238) a virtual trip, such as in response to a selection by a user (e.g., the operator of the vehicle), in response to an occurrence of a condition, or automatically at a certain time. According to embodiments, the virtual trip may have an associated virtual vehicle that is operated by a virtual operator within a virtual environment. In association with initiating the virtual trip, the processor 205 may cause the user interface 220 to display certain visual content associated with the virtual trip (not shown in FIG. 2). For example, the user interface may display an indication of the virtual vehicle on a virtual map, and/or other content. Certain aspects of the virtual trip may be selectable or configurable by the operator, such as via the user interface, as further discussed herein. For example, the operator may select different virtual operators to "train" or accumulate statistics using the data model.

Prior to, after, or concurrently with initiating the virtual trip, the processor 205 may retrieve (240) the data model from the memory 215. In an optional implementation, the processor 205 may additionally retrieve (242) additional data (e.g., social networking data) from the server 225. According to embodiments, the social network data may be based on one or more contacts of the operator, where the one or more contacts may have one or more associated additional virtual vehicles with one or more additional virtual vehicle operators. Virtual operation of the one or more additional virtual vehicles may be based on one or more additional data models associated with real-life vehicle operation by the one or more contacts of the operator. According to embodiments, the virtual trip associated with the virtual operator may reflect at least some of the virtual operation of the one or more additional virtual vehicles, as further discussed herein.

After retrieving the data model, the processor 205 may determine (244), based on at least part of the data model, a set of virtual vehicle movements for the virtual vehicle. Generally, the set of virtual vehicle movements may reflect the vehicle operation characteristics included in the data model, where the relative performance level(s) of the set of virtual vehicle movements may correspond to the relative performance level(s) of the vehicle operation characteristics. For example, if the data model reflects that the operator has a score of 8.5 out of 10.0 in the acceleration characteristic in real-life vehicle operation, the corresponding virtual vehicle operator may also have a score of 8.5 out of 10.0 in a virtual acceleration characteristic, for which the set of virtual vehicle movements may account (i.e., the acceleration of the virtual vehicle is very good). In an additional example, if the data model reflects that the operator has a score of 3.0 out of 10.0 in the steering characteristic in real-life vehicle operation, the corresponding virtual vehicle operator may also have a score of 3.0 out of 10.0 in a virtual steering characteristic, for which the set of virtual vehicle movements may account (i.e., the steering of the virtual vehicle is not good).

According to embodiments, the set of virtual vehicle movements may be associated with one or more vignettes or scenes that may be incorporated into or associated with the virtual environment. Generally, a vignette may be a virtual recreation of an encounter or driving event that may occur in real life. For example, a vignette may be a virtual vehicle's interaction with a pedestrian walkway (i.e., the approach to, stopping at, and acceleration from the pedestrian walkway); another vignette may be a virtual vehicle's approach to and right-hand turn through a red light; and another vignette may be a virtual vehicle's switching lanes in traffic. It should be appreciated that additional vignettes are envisioned.

The processor 205 may determine a set of virtual vehicle movements in associated with a given vignette based on a relevant portion of the data model. For example, for a pedestrian crosswalk vignette, if the data model indicates that the operator is prone to sudden stopping, a virtual vehicle movement may be a sudden stop by the virtual vehicle upon approach to the pedestrian crosswalk. As another example, for a right-hand turn through a red light vignette, if the data model indicates that the operator comes to a full stop at red lights prior to a right-hand turn, a virtual vehicle movement may similarly be a full stop by the virtual vehicle upon approach to the red light prior to turning right.

According to alternative or additional embodiments, the set of virtual vehicle movements may be associated with a game or challenge that may be incorporated into or associated with the virtual environment. Generally, a game may have a set of goals or challenges to be carried out by a virtual vehicle within the virtual environment. For example, a game may be a simulated delivery of one or more products or goods from a first virtual location to a second virtual location; and another game may be a ride share simulation facilitated by the virtual vehicle from a first virtual location to a second virtual location. It should be appreciated that additional games are envisioned.

The processor 205 may determine a set of virtual vehicle movements associated with a given game based on a relevant portion of the data model. For example, for a delivery game, if the data model indicates that the operator is prone to sudden accelerations, a virtual vehicle movement may be a sudden acceleration by the virtual vehicle upon initiating a delivery from a first location. As another example, for a ride sharing simulation with the virtual vehicle transporting a virtual passenger, if the data model indicates that the operator is prone to sudden stops, a virtual vehicle movement may be a sudden stop by the virtual vehicle approaching a stop sign.

After determining the set of virtual vehicle movements, the processor 205 may provide 246 data indicative of the set of virtual vehicle movements to the user interface 220. In turn, the user interface 220 may display (248) the set of virtual vehicle movements in association with the virtual trip. It should be appreciated that the functionalities of (244), (246), and (248) may be repeated indefinitely until occurrence of a certain condition (e.g., a selection by the operator, stoppage of the vehicle, etc.). Thus, the user interface 220 may continuously display and update the virtual trip according to the determined set of virtual vehicle movements.

In embodiments, the operator of the vehicle may view the virtual trip displayed by the user interface 220, as well as any vignettes or games included therein. By viewing the virtual trip, the operator may be inclined or motived to adjust real-world vehicle operating behavior, especially to improve aspects or areas that may need improvement. For example, if the operator notices that the virtual operator is prone to sudden or hectic lane changes, the operator may make an effort to execute smoother real-life lane changes. As an additional example, if the operator notices that the virtual operator speeds through virtual school zones, the operator may make an effort to slow down through real-life school zones.

The processor 205 may determine (250) if the vehicle is stopped, which may be a trigger or condition for stopping or pausing the virtual trip (although it should be appreciated that other triggers or conditions for stopping or pausing the virtual trip are envisioned). If the vehicle is not stopped ("NO"), processing may return to (244 or 242), or proceed to other functionality. If the vehicle is stopped ("YES"), the processor 205 may generate a virtual trip summary and provide (252) the virtual trip summary to the user interface 220. According to embodiments, the virtual trip summary may contain scores, points, achievements, or the like, which may be associated with any vignettes or games included in the virtual trip. Additional or alternatively, the virtual trip summary may contain ratings for certain virtual vehicle operation characteristics for the corresponding virtual driver, which may correspond to the vehicle operation characteristics for the operator included in the data model.

The user interface 220 may display (254) the virtual trip summary. Accordingly, the operator may review the virtual trip summary to be updated on any progress made by the virtual operator in certain areas, among other uses. Additionally, the operator may be inclined or motivated to modify or improve any real-world driving behaviors in response to reviewing the virtual trip summary.

FIGS. 3A-3K depict respective example interfaces associated with various functionalities described herein. In particular, the example interfaces relate to operation of a virtual vehicle within a virtual environment. In embodiments, a computing device (e.g., a smartphone) may be configured to display the interfaces, where the computing device may be located within a vehicle and an operator of the vehicle may review the interfaces. It should be appreciated that the interfaces are merely exemplary, and that additional and alternative content is envisioned.

Figure 3A:
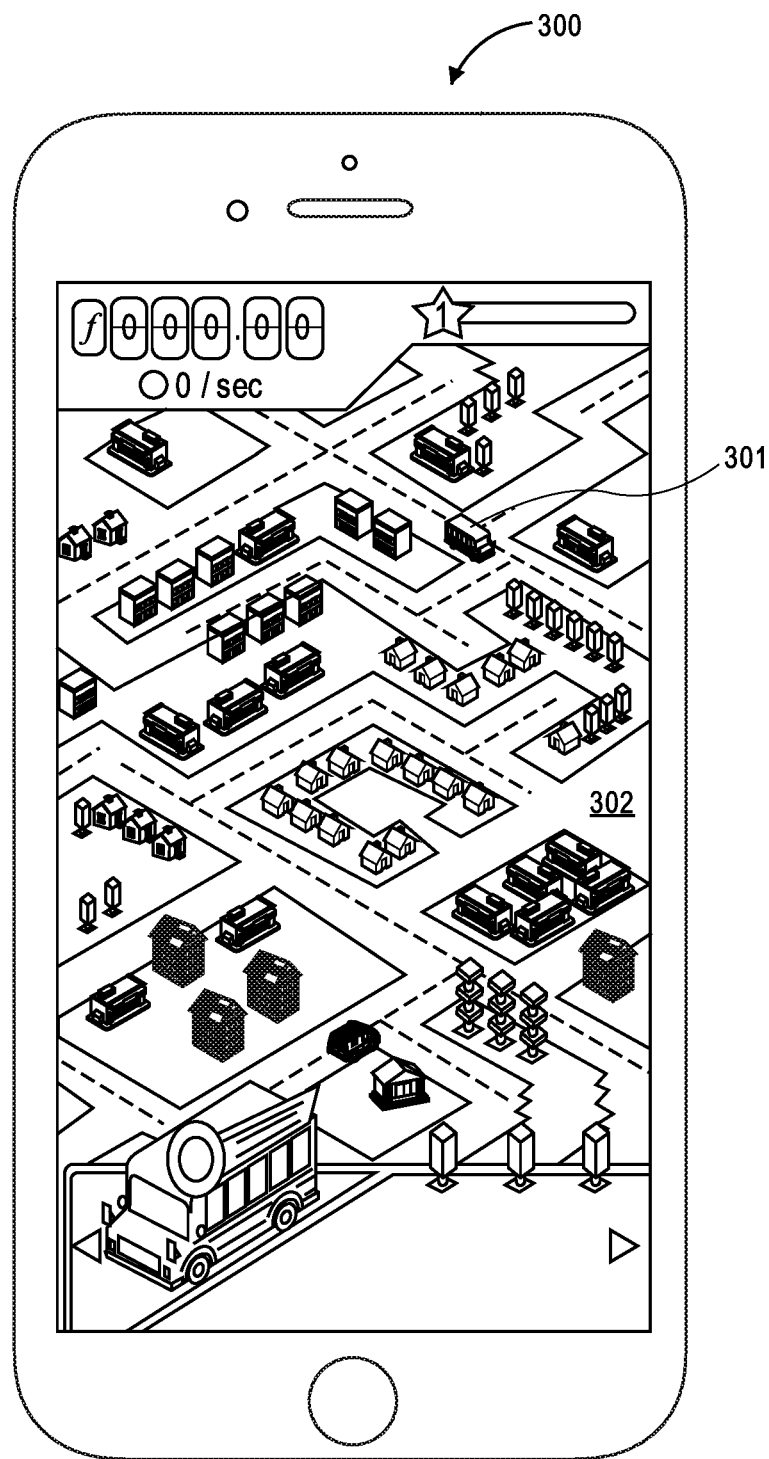
FIGS. 3A-3K illustrate example interfaces associated with virtual operation of a set of virtual vehicles in a virtual environment, in accordance with some embodiments.

FIG. 3A depicts an example interface 300 associated with a virtual environment. The interface 300 may include a virtual map 302 consisting of various roadways, buildings, homes, landscape elements, and/or the like. The interface 300 may further include a virtual vehicle 301 located on the virtual map 302 and configured to travel on the virtual map 302, such as according to a set of virtual vehicle movements determined from a driving model.

Figure 3B:
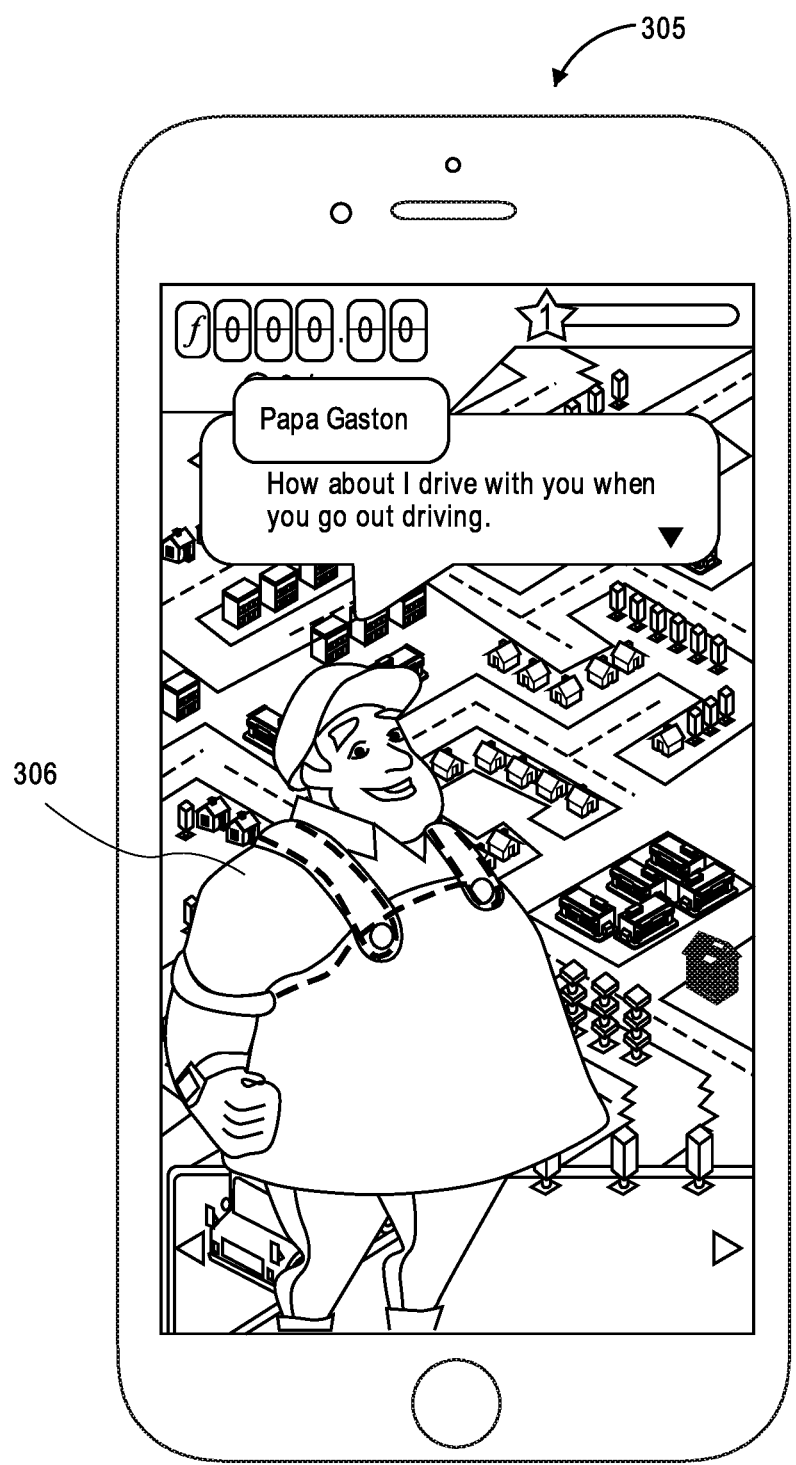

FIG. 3B depicts an example interface 305 associated with the virtual environment. The interface 305 depicts a virtual character 306 (as shown: Papa Gaston) that may represent a virtual operator of a virtual vehicle. The operator of the vehicle may select the virtual character 306 to be the virtual operator of the virtual vehicle, and/or to access additional information about the virtual character 306. It should be appreciated that the operator may select the virtual character 306 from a listing of virtual characters.

Figure 3C:
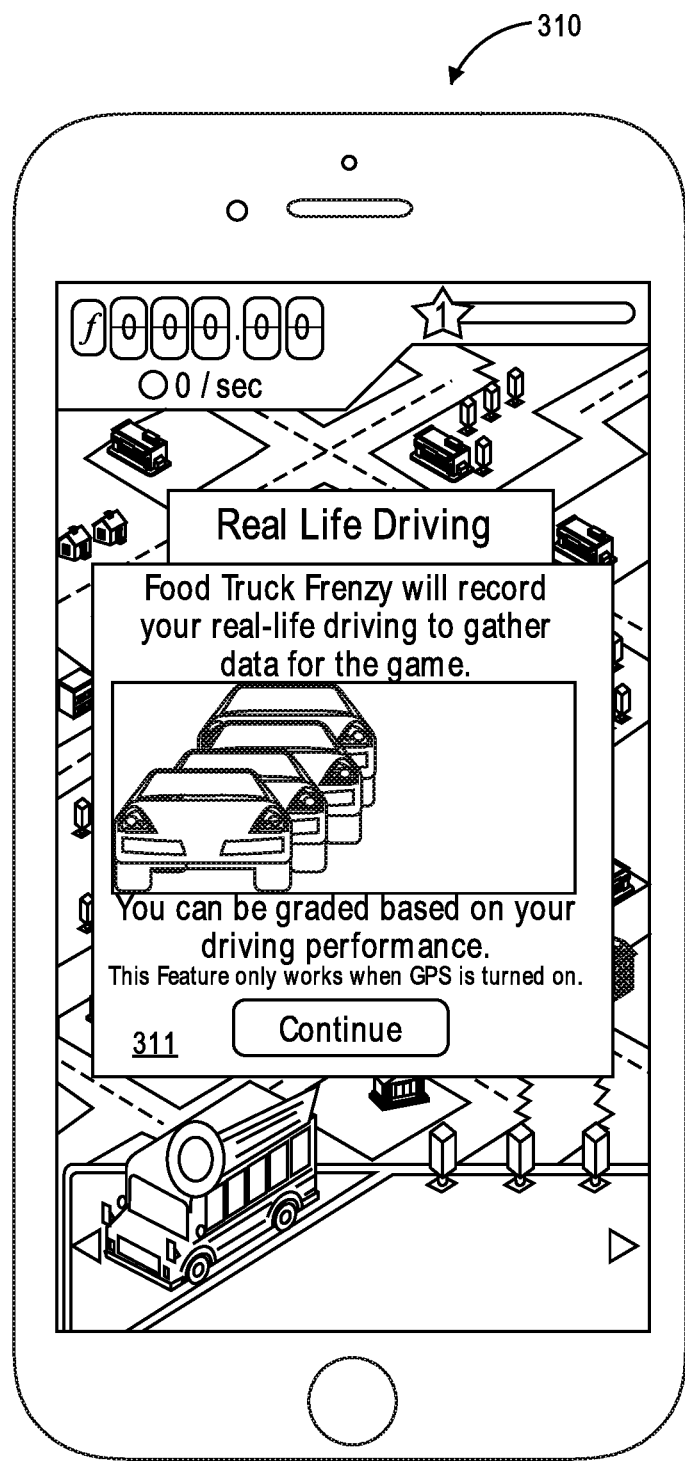

FIG. 3C depicts an example interface 310 associated with the virtual environment. The interface 310 depicts a game or challenge 311 (as shown: "Food Truck Frenzy"), indicating that various sensors (e.g., a GPS sensor) will record real-life driving data of the operator to be used as part of the game or challenge 311. In embodiments, the real-life driving data may be reflected in the data model generated for the operator.

Figure 3D:
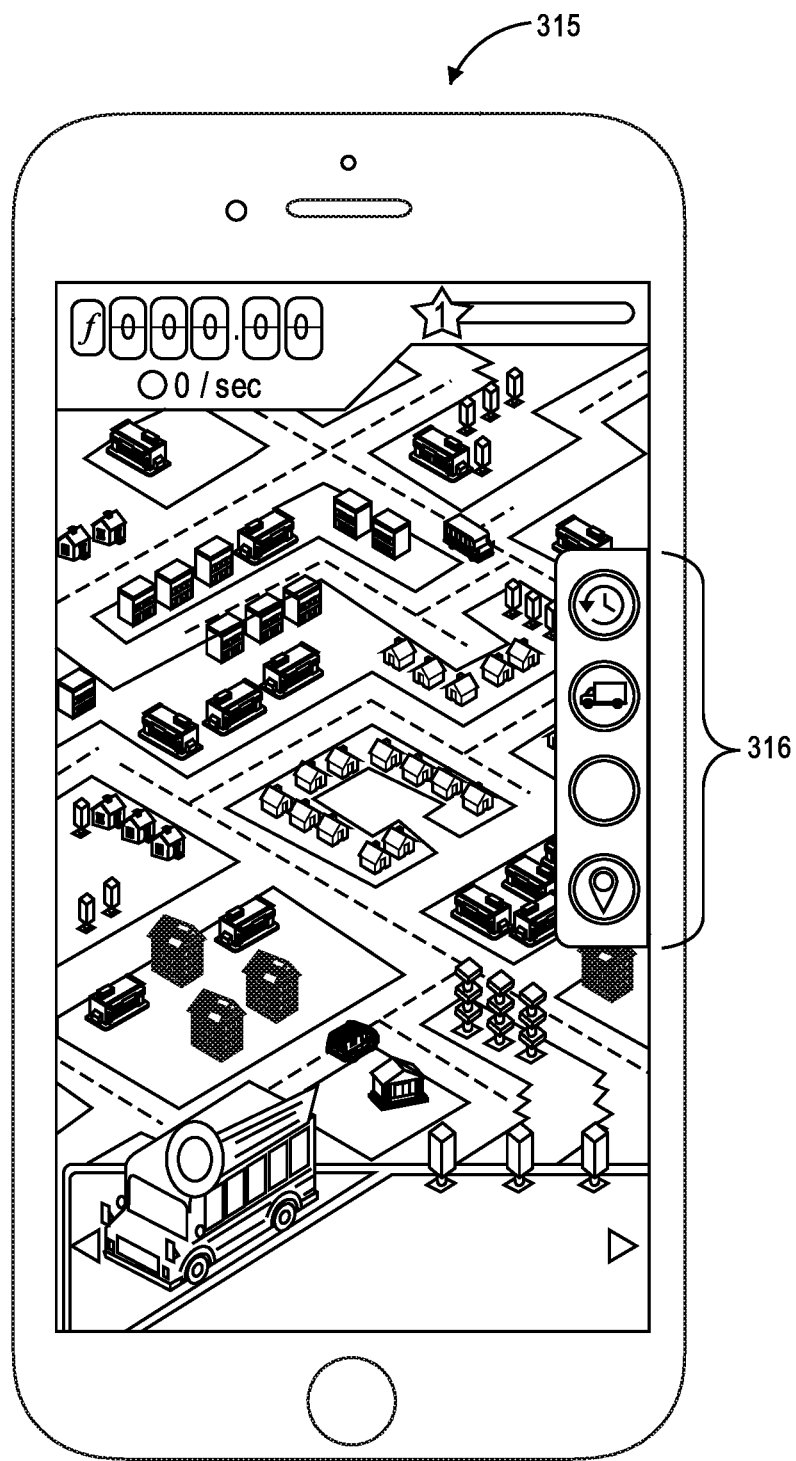

FIG. 3D depicts an example interface 315 associated with the virtual environment. The interface 315 includes a set of selections or options 316 associated with the virtual environment including a history or log selection, one or more game or challenge selections, and a location selection. It should be appreciated that alternative and additional selections associated with the virtual environment are envisioned. The operator may interface with the user interface to make certain selections and select configurations for the virtual environment or virtual trip.

Figure 3E:
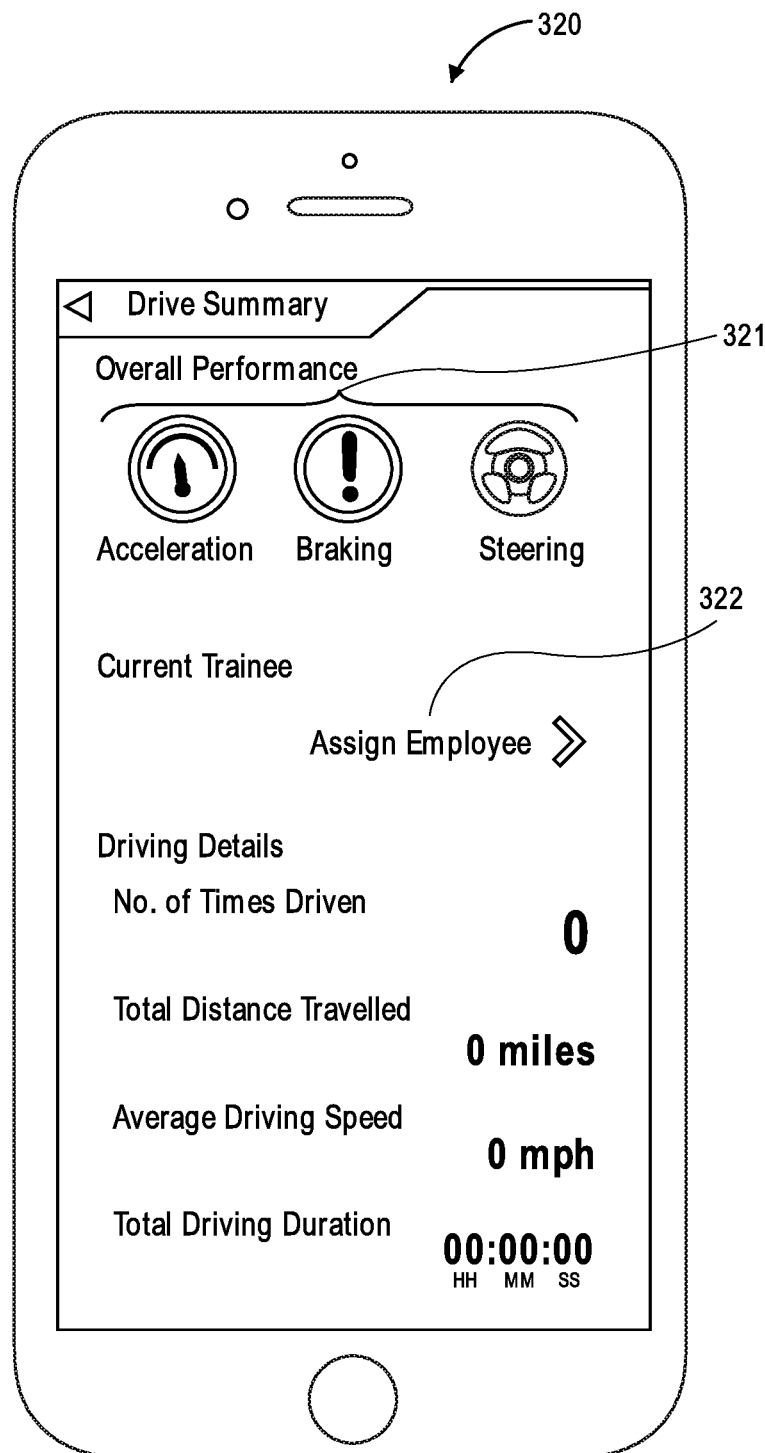

FIG. 3E depicts an example interface 320 indicating statistics and other information associated with the operator of the vehicle. The statistics and information are shown with relevant categories without any underlying data. The interface 320 includes performance data indicators 321 (as shown: acceleration, braking, and steering). Further, the interface 320 includes an assign selection 322 that may enable the operator to select one or more virtual characters to be one or more virtual operators within the virtual environment.

Figure 3F:
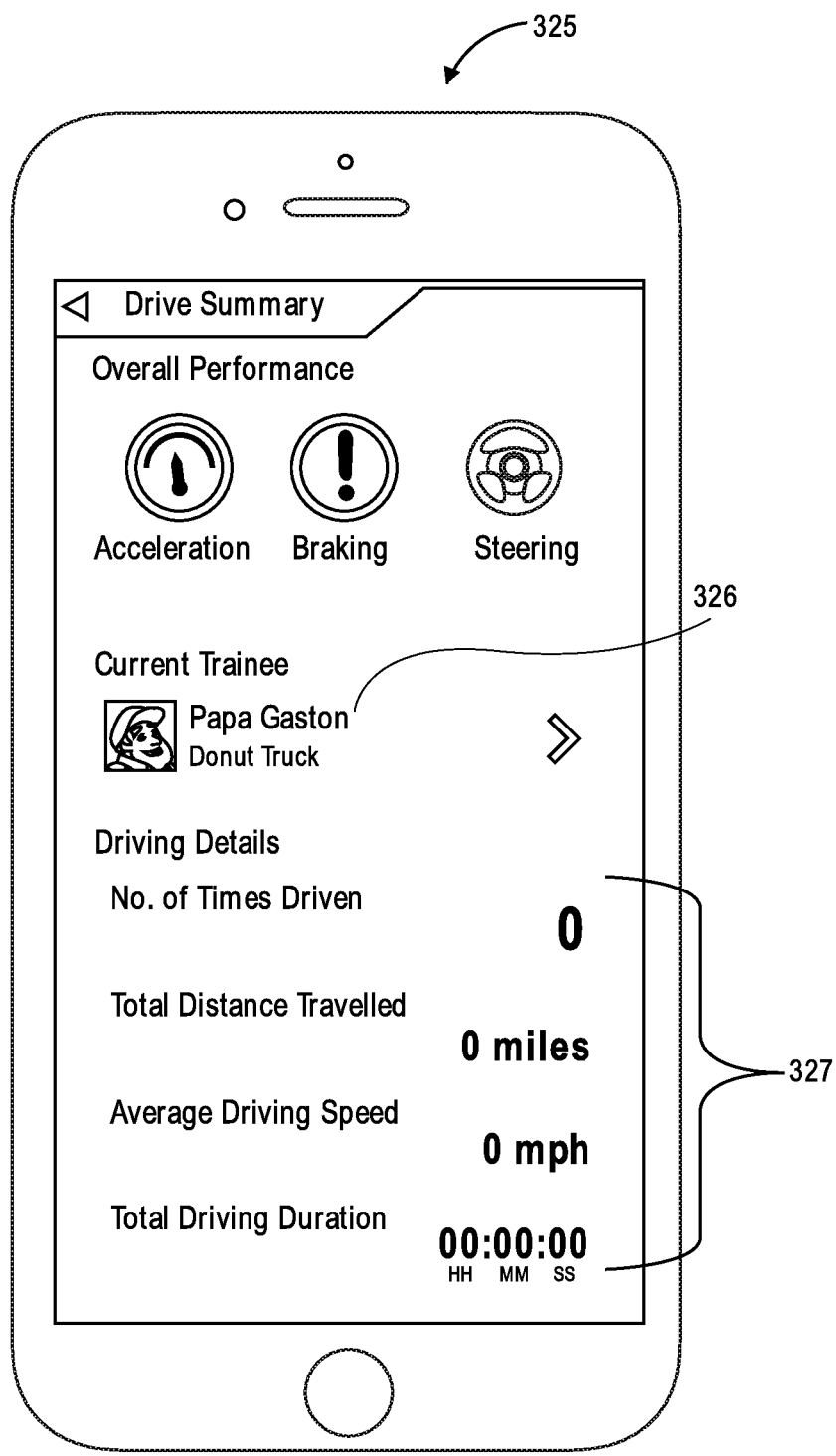

FIG. 3F depicts an example interface 325 to reflect a selection of a virtual character. In particular, the interface 325 includes an identification 326 of a virtual character (as shown: Papa Gaston) who the operator may select to be a virtual operator within the virtual environment, where operation of a virtual vehicle by the virtual operator may be based on the real-life operation of the vehicle by the operator. The interface 325 further includes a set of information 327 (as shown as an empty data set) associated with the virtual vehicle operation performance of the assigned virtual operator. It should be appreciated that, in certain embodiments, the set of information 327 may be associated with the real-life vehicle operation performance of the operator.

Figure 3G:

FIG. 3G depicts an example interface 330 indicating certain information associated with the game or challenge in the virtual environment. In particular, the interface 330 includes information 331 that describes virtual money earned by a virtual operator(s) within the virtual environment, and specifically the virtual money earned in association with a game or challenge of the virtual environment. In embodiments, the virtual money may be used by the operator as credits to purchase or unlock certain goods or services.

Figure 3H:

FIG. 3H depicts an example interface 335 associated with information for the virtual operator (as shown: Papa Gaston). The interface 335 includes an example driving log 336 for the virtual operator that indicates the performance metrics acceleration, braking, and steering, as well as a rating or score for each performance metric. In embodiments, the driving log 336 may depict how any of the performance metrics adjust or modify based on any new driving events by the virtual operator. For example, the interface 335 may depict that the acceleration performance metric for Papa Gaston improves after a driving event.

Figure 3I:
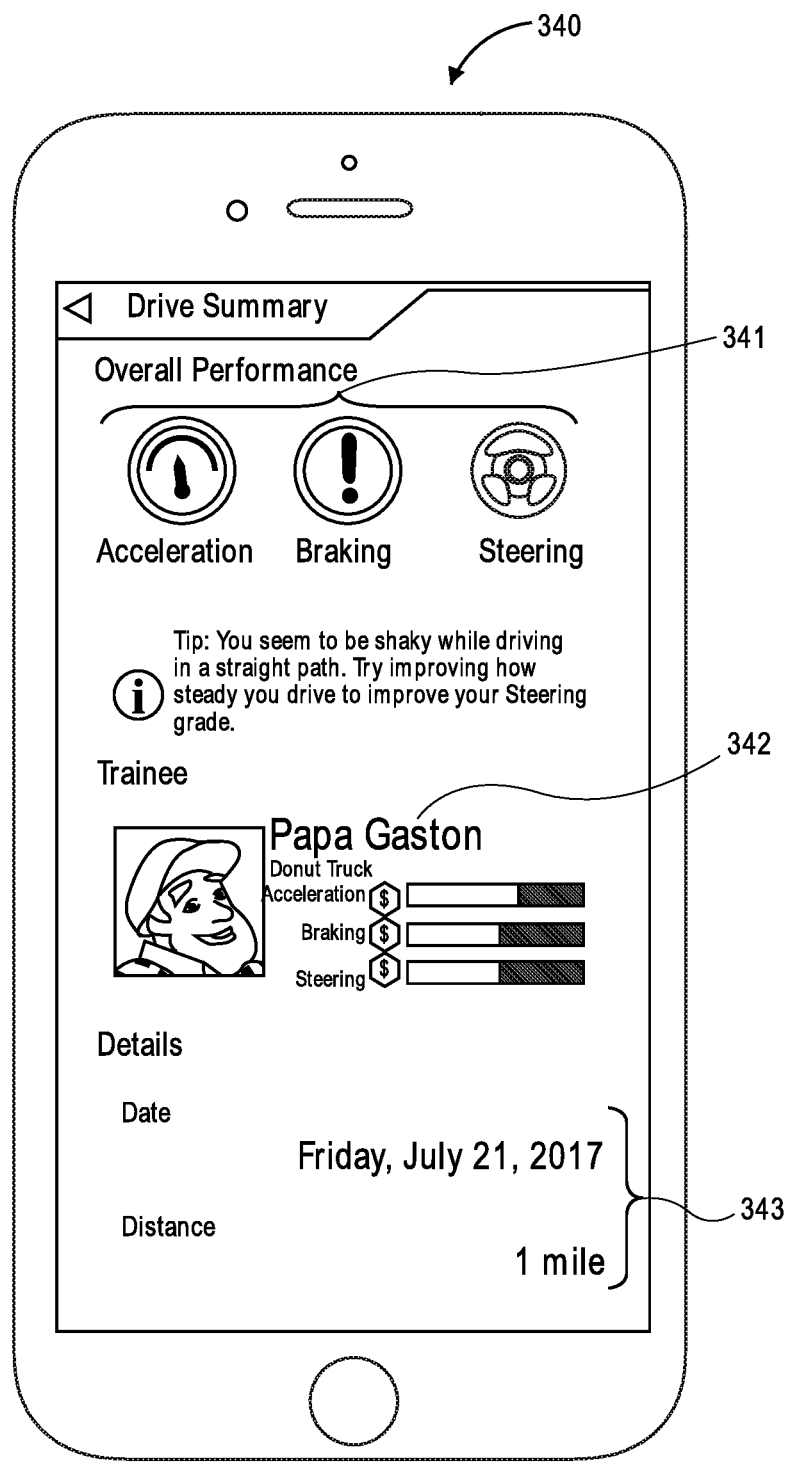

FIG. 3I depicts an example interface 340 depicting certain information and data associated with the performance of the operator and the virtual operator. The interface 340 includes performance data indicators 341 (as shown: acceleration, braking, and steering) for the operator which may reflect a cumulative performance of the operator in operating the vehicle. The interface 340 further includes performance data indicators 342 (as shown: acceleration, braking, and steering) for the virtual operator, as well as information 343 associated with a trip completed by the operator (or in some cases, a virtual trip completed by the virtual operator). According to embodiments, each of the performance data indicators 341 of the operator and the performance data indicators 342 of the virtual operator may adjust based on the trip completed by the operator as identified by the information 343.

Figure 3J:
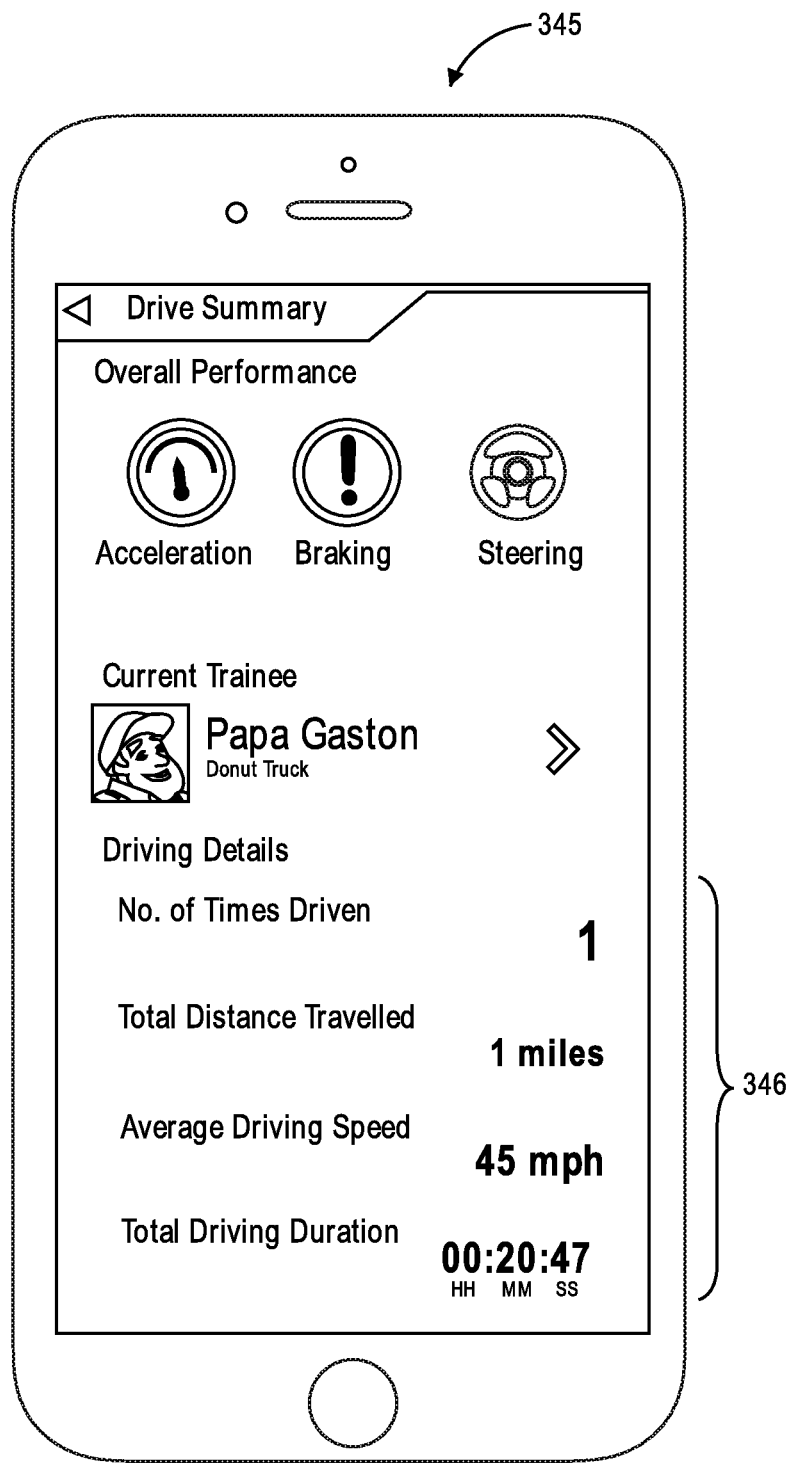

FIG. 3J depicts an example interface 345 depicting information with a selected virtual character (as shown: Papa Gaston). The interface 345 includes a set of information 346 associated with the virtual vehicle operation performance of the assigned virtual operator. For example, as depicted in FIG. 3J, the set of information 346 includes virtual vehicle performance data for Pap Gaston after a trip of one (1) mile. It should be appreciated that, in certain embodiments, the set of information 346 may be associated with the real-life vehicle operation performance of the operator.

Figure 3K:
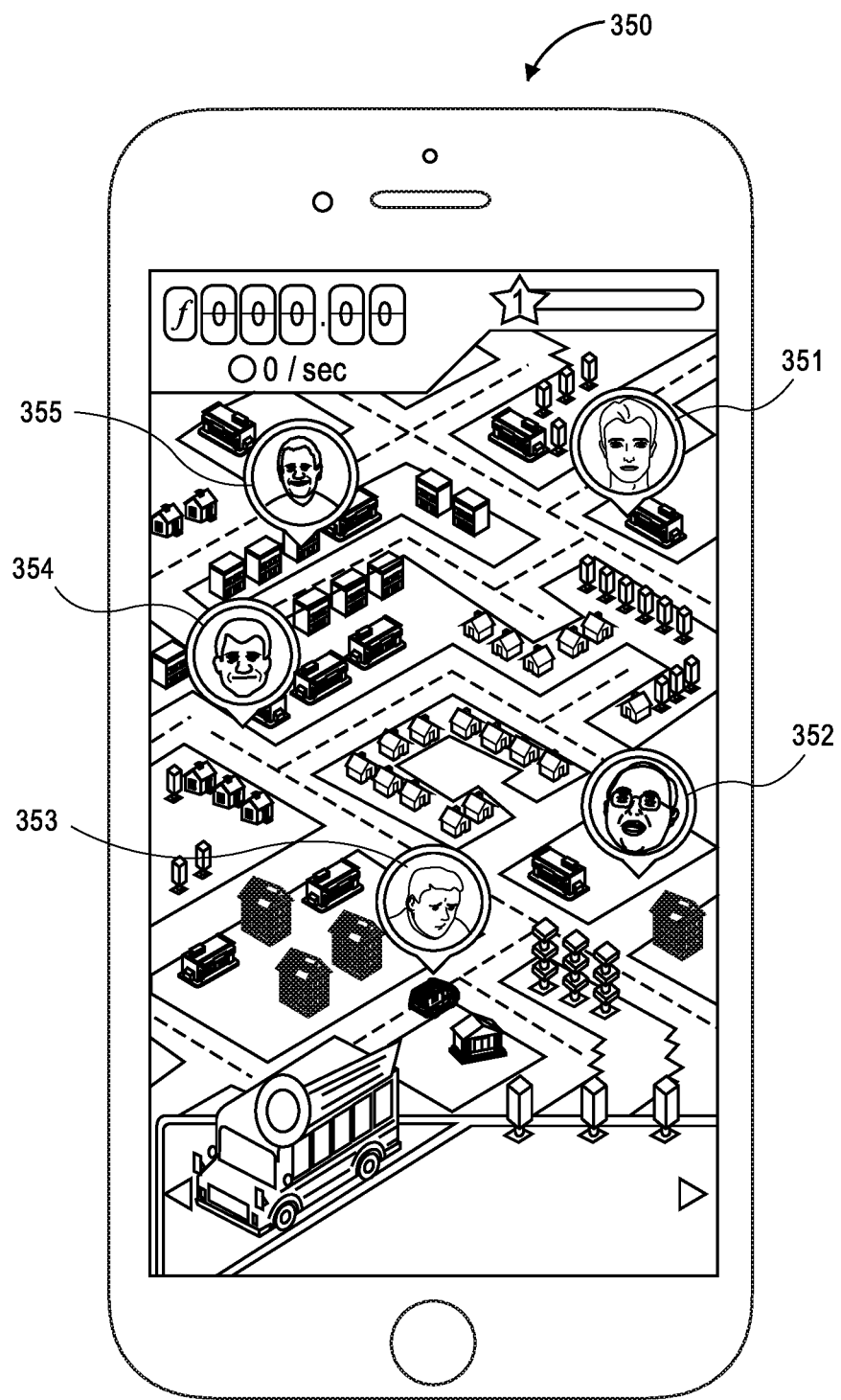

FIG. 3K depicts an example interface 350 depicting a set of representations (351-355) of a set of contacts of the operator of the vehicle. According to embodiments, each of the representations 351-355 may represent a virtual operator associated with a contact of the operator. In this regard, the set of representations 351-355 may be depicted on the virtual map, with or without an indication of the virtual operator associated with the operator. Similar to the virtual operator associated with the operator, the set of virtual operators associated with the set of contacts of the operator may complete trips, accumulate statistics and rewards, and incorporate other functionalities.

Figure 4:
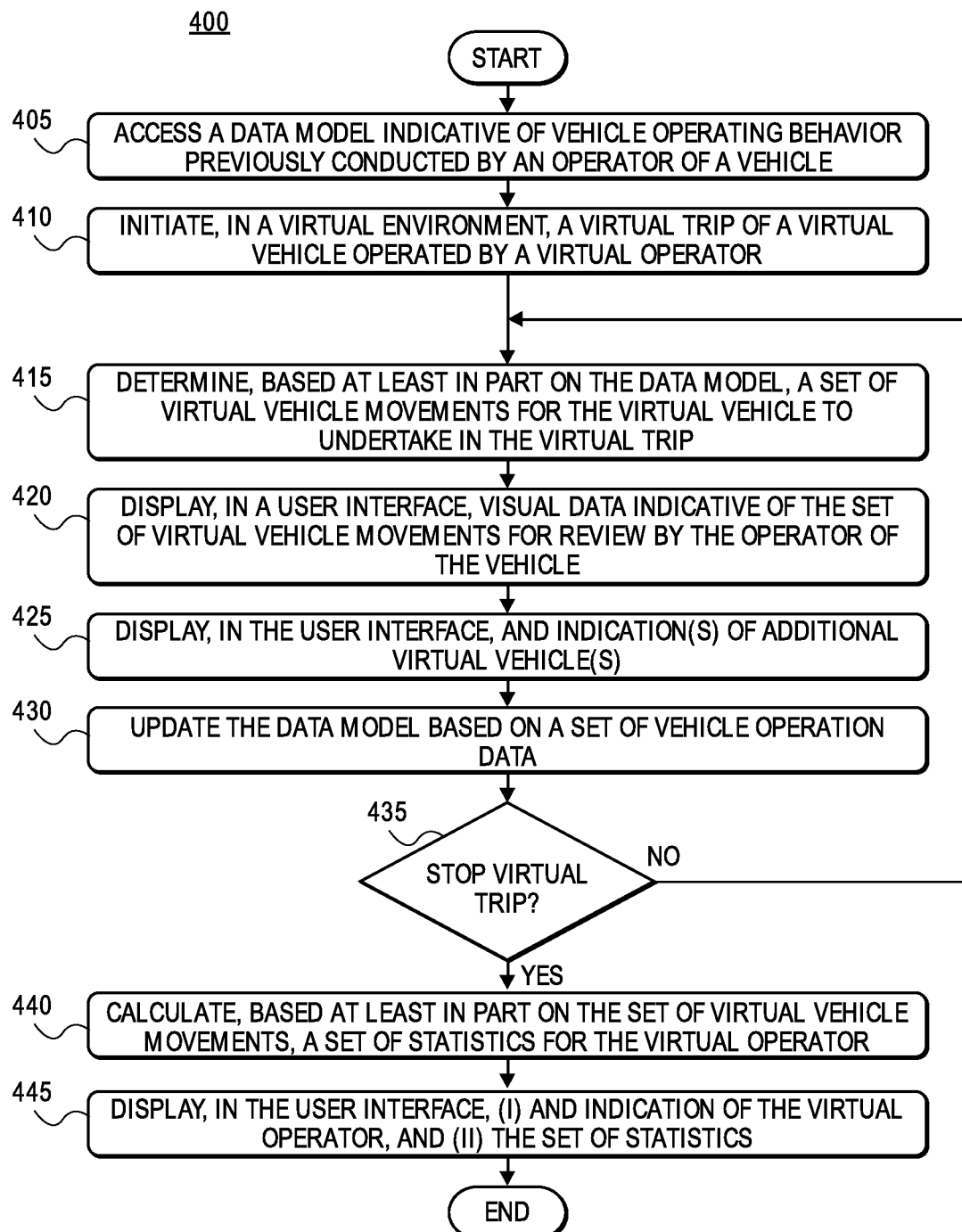
FIG. 4 is a block diagram of an example method of modeling vehicle operating behavior in a virtual environment, in accordance with some embodiments.

FIG. 4 depicts a block diagram of an example method 400 of modeling vehicle operating behavior in a virtual environment. The method 400 may be facilitated by at least one computing device that may be associated with the vehicle, where the computing device may be on board the vehicle. The computing device may be configured to communicate with one or more electronic devices or components, such as one or more sensors and/or back end components.

The method 400 may begin when the computing device accesses (block 405), from a memory, a data model indicative of vehicle operating behavior previously conducted by an operator of a vehicle. According to embodiments, the data model may include a set of performance characteristics or metrics indicative of the vehicle operating behavior. The computing device may initiate (block 410), in the virtual environment, a virtual trip of a virtual vehicle operated by a virtual operator. In embodiments, the computing device may display, in a user interface, a virtual map and an indication of the virtual vehicle located on the virtual map.

The computing device may determine (block 415), based at least in part on the data model, a set of virtual vehicle movements for the virtual vehicle to undertake in the virtual trip. In implementations, the computing device may initiate a virtual driving vignette as part of the virtual trip, and may determine, based at least in part on the data model, the set of virtual vehicle movements for the virtual vehicle to undertake in the virtual driving vignette. In alternative or additional implementations, the computing device may determine, from the data model, a vehicle movement previously undertaken by the operator of the vehicle, and determine a virtual vehicle movement of the set of virtual vehicle movements that corresponds to the vehicle movement.

The computing device may display (block 420), in the user interface, visual data indicative of the set of virtual vehicle movements for review by the operator of the vehicle. In embodiments, the computing device may display the visual data indicative of the set of virtual vehicle movements in response to detecting that the vehicle is stopped (e.g., stopped at a red traffic signal).

The computing device may display (block 425), in the user interface, an indication(s) of an additional virtual vehicle(s). In embodiments, the computing device may identify a contact(s) of the operator of the vehicle, wherein the additional virtual vehicle(s) having an additional virtual operator(s) is associated with the contact(s). For example, the contact(s) may be connected to the operator via a social networking service.

The computing device may update (block 430) the data model based on a set of vehicle operation data. In embodiments, the computing device may access, from a set of sensors, the set of vehicle operation data associated with current operation of the vehicle by the operator, and may update the data model based on at least a portion of the set of vehicle operation data.

The computing device may determine (block 435) whether to stop the virtual trip. In embodiments, the determination may be based on one or more factors or conditions, such as whether the vehicle is stopped or turned off, whether the operator selects to stop the virtual trip, whether the virtual trip has ended, or other factors or conditions. If the computing device determines to not stop the virtual trip ("NO"), processing may return to block 415 in which the computing device may determine an additional set of virtual vehicle movements based on the original data model or the updated data model. If the computing device determines to stop the virtual trip ("YES"), processing may proceed to block 440.

At block 440, the computing device may calculate, based at least in part on the set of virtual vehicle movements, a set of statistics for the virtual operator. In embodiments, the set of statistics may include various data or information associated with the virtual operation of the virtual vehicle that may correspond to the respective data or information included in the data model. The computing device may further display (block 445), in the user interface, (i) an indication of the virtual operator, and (ii) the set of statistics. Accordingly, the operator may review the displayed information and may be motivated to adjust or modify his/her own vehicle operation behavior or tendencies.

Figure 5:
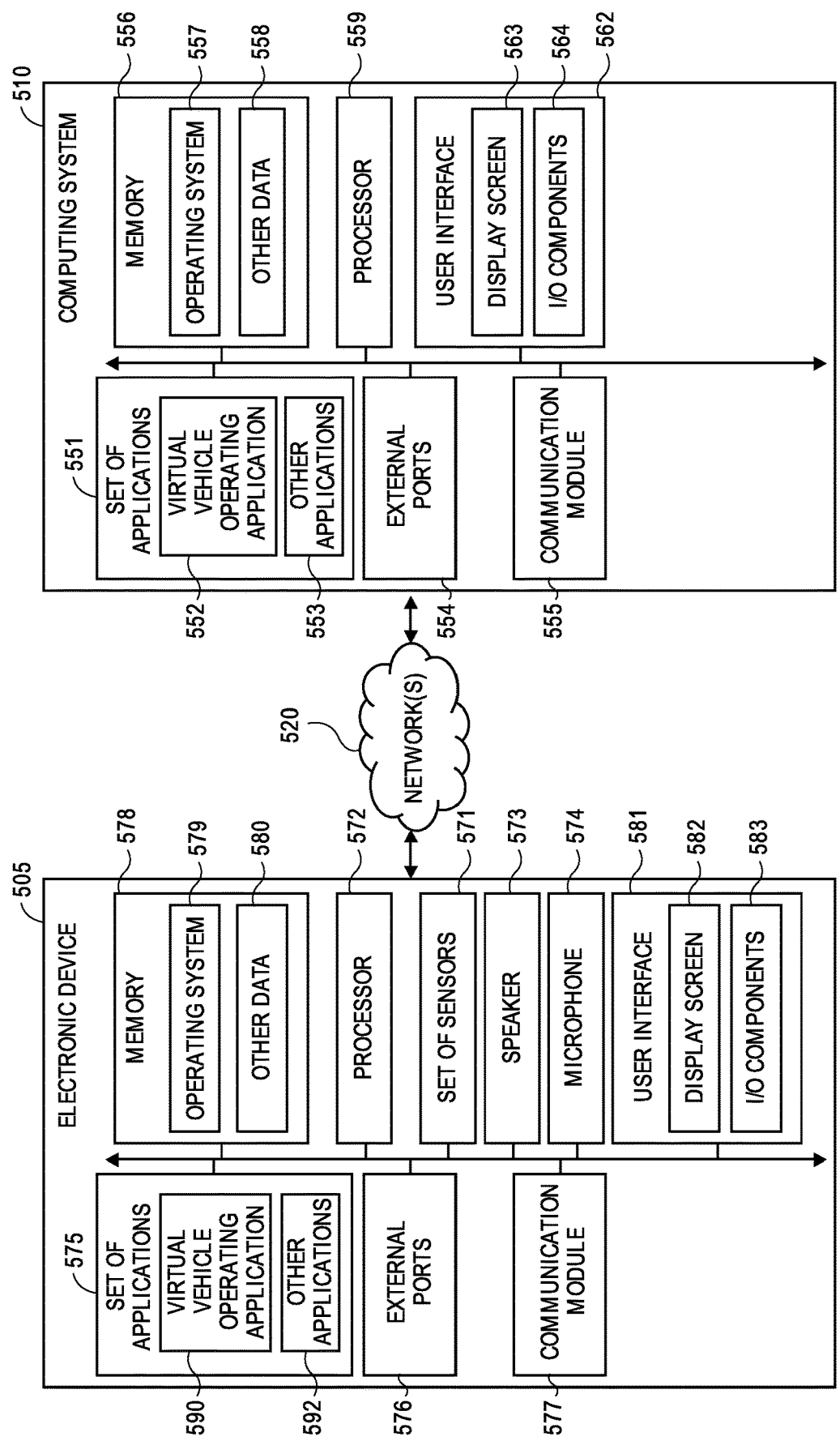
FIG. 5 is a hardware diagram of an example electronic device and an example computing system, in accordance with some embodiments.

FIG. 5 illustrates a hardware diagram of an example electronic device 505 (such as the computer 106 and/or the electronic device 111 as discussed with respect to FIG. 1) and an example computing system 510 (such as the remote computing system 110 as discussed with respect to FIG. 1), in which the functionalities as discussed herein may be implemented.

The electronic device 505 may include a processor 572 as well as a memory 578. The memory 578 may store an operating system 579 capable of facilitating the functionalities as discussed herein as well as a set of applications 575 (i.e., machine readable instructions). For example, one of the set of applications 575 may be a virtual vehicle operating application 590 configured to facilitate various of the functionalities as discussed herein. It should be appreciated that one or more other applications 592 are envisioned.

The processor 572 may interface with the memory 578 to execute the operating system 579 and the set of applications 575. According to some embodiments, the memory 578 may also include other data 580 including data associated with a data model, sensor data collected from a set of sensors, and/or other data. The memory 578 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The electronic device 505 may further include a communication module 577 configured to communicate data via one or more networks 520. According to some embodiments, the communication module 577 may include one or more transceivers (e.g., WWAN, WLAN, and/or WPAN transceivers) functioning in accordance with IEEE standards, 3GPP standards, or other standards, and configured to receive and transmit data via one or more external ports 576. For example, the communication module 577 may interface with another device, component, or sensors via the network(s) 520 to retrieve sensor data.

The electronic device 505 may include a set of sensors 571 such as, for example, a location module (e.g., a GPS chip), an image sensor, an accelerometer, a clock, a gyroscope, a compass, a yaw rate sensor, a tilt sensor, telematics sensors, and/or other sensors. The electronic device 505 may further include a user interface 581 configured to present information to a user and/or receive inputs from the user. As shown in FIG. 5, the user interface 581 may include a display screen 582 and I/O components 583 (e.g., ports, capacitive or resistive touch sensitive input panels, keys, buttons, lights, LEDs). According to some embodiments, the user may access the electronic device 505 via the user interface 581 to review information such as virtual vehicle operation data, alerts, or notifications, make selections, and/or perform other functions. Additionally, the electronic device 505 may include a speaker 573 configured to output audio data and a microphone 574 configured to detect audio.

In some embodiments, the electronic device 505 may perform the functionalities as discussed herein as part of a "cloud" network or may otherwise communicate with other hardware or software components within the cloud to send, retrieve, or otherwise analyze data.

As illustrated in FIG. 5, the electronic device 505 may communicate and interface with the computing system 510 via the network(s) 520. The computing system 510 may include a processor 559 as well as a memory 556. The memory 556 may store an operating system 557 capable of facilitating the functionalities as discussed herein as well as a set of applications 551 (i.e., machine readable instructions). For example, one of the set of applications 551 may be a virtual vehicle operating application 552 configured to facilitate various of the functionalities discussed herein. It should be appreciated that one or more other applications 553 are envisioned.

The processor 559 may interface with the memory 556 to execute the operating system 557 and the set of applications 551. According to some embodiments, the memory 556 may also include other data 558, such as data associated with a data model, sensor data collected from a set of sensors, and/or other data. The memory 556 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The computing system 510 may further include a communication module 555 configured to communicate data via the one or more networks 520. According to some embodiments, the communication module 555 may include one or more transceivers (e.g., WWAN, WLAN, and/or WPAN transceivers) functioning in accordance with IEEE standards, 3GPP standards, or other standards, and configured to receive and transmit data via one or more external ports 554.

For example, the communication module 555 may receive, from the electronic device 505, a set of vehicle operation data generated by a set of sensors.

The computing device 510 may further include a user interface 562 configured to present information to a user and/or receive inputs from the user. As shown in FIG. 5, the user interface 562 may include a display screen 563 and I/O components 564 (e.g., ports, capacitive or resistive touch sensitive input panels, keys, buttons, lights, LEDs). According to some embodiments, the user may access the computing device 510 via the user interface 562 to review information, make selections, and/or perform other functions.

In some embodiments, the computing device 510 may perform the functionalities as discussed herein as part of a "cloud" network or may otherwise communicate with other hardware or software components within the cloud to send, retrieve, or otherwise analyze data.

In general, a computer program product in accordance with an embodiment may include a computer usable storage medium (e.g., standard random access memory (RAM), an optical disc, a universal serial bus (USB) drive, or the like) having computer-readable program code embodied therein, wherein the computer-readable program code may be adapted to be executed by the processors 572, 559 (e.g., working in connection with the respective operating systems 579, 557) to facilitate the functions as described herein. In this regard, the program code may be implemented in any desired language, and may be implemented as machine code, assembly code, byte code, interpretable source code or the like (e.g., via Golang, Python, Scala, C, C++, Java, Actionscript, Objective-C, Javascript, CSS, XML). In some embodiments, the computer program product may be part of a cloud network of resources.

Embodiments of the techniques described in the present disclosure may include any number of the following aspects, either alone or combination:

1. A computer-implemented method of modeling vehicle operating behavior in a virtual environment, the method comprising: accessing, from a memory, a data model indicative of vehicle operating behavior previously conducted by an operator of a vehicle; initiating, by a processor in the virtual environment, a virtual trip of a virtual vehicle operated by a virtual operator; and conducting, by the processor, the virtual trip, including: determining, based at least in part on the data model, a set of virtual vehicle movements for the virtual vehicle to undertake in the virtual trip, and displaying, in a user interface, visual data indicative of the set of virtual vehicle movements for review by the operator of the vehicle.

2. The computer-implemented method of claim 1, further comprising: accessing a set of vehicle operation data associated with current operation of the vehicle by the operator; and updating the data model based on at least a portion of the set of vehicle operation data.

3. The computer-implemented method of claim 2, wherein conducting the virtual trip further includes: determining, based at least in part on the data model that was updated, an additional set of virtual vehicle movements for the virtual vehicle to undertake in the virtual trip, and displaying, in the user interface, additional visual data indicative of the additional set of virtual vehicle movements for review by the operator of the vehicle.

4. The computer-implemented method of claim 2, wherein determining, based at least in part on the data model, the set of virtual vehicle movements for the virtual vehicle to undertake in the virtual trip comprises: determining, based at least in part on the data model that was updated, the set of virtual vehicle movements for the virtual vehicle to undertake in the virtual trip.

5. The computer-implemented method of any one of claims 1 to 4, wherein initiating, in the virtual environment, the virtual trip of the virtual vehicle operated by the virtual operator comprises: displaying, in the user interface, (i) a virtual map, and (ii) an indication of the virtual vehicle located on the virtual map.

6. The computer-implemented method of any one of claims 1 to 5, wherein determining, based at least in part on the data model, the set of virtual vehicle movements for the virtual vehicle to undertake in the virtual trip comprises: initiating a virtual driving vignette as part of the virtual trip, and determining, based at least in part on the data model, the set of virtual vehicle movements for the virtual vehicle to undertake in the virtual driving vignette.

7. The computer-implemented method of any one of claims 1 to 6, wherein determining, based at least in part on the data model, the set of virtual vehicle movements for the virtual vehicle to undertake in the virtual trip comprises: determining, from the data model, a vehicle movement previously undertaken by the operator of the vehicle, and determining a virtual vehicle movement of the set of virtual vehicle movements that corresponds to the vehicle movement.

8. The computer-implemented method of any one of claims 1 to 7, wherein displaying, in the user interface, the visual data indicative of the set of virtual vehicle movements for review by the operator of the vehicle comprises: detecting that the vehicle is stopped, and in response to detecting that the vehicle is stopped, displaying, in the user interface, the visual data indicative of the set of virtual vehicle movements for review by the operator of the vehicle.

9. The computer-implemented method of any one of claims 1 to 8, further comprising: calculating, based at least in part on the set of virtual vehicle movements, a set of statistics for the virtual operator; and displaying, in the user interface, (i) an indication of the virtual operator, and (ii) the set of statistics.

10. The computer-implemented method of any one of claims 1 to 9, further comprising: identifying a contact of the operator of the vehicle, wherein an additional virtual vehicle having an additional virtual operator is associated with the contact; and displaying, in the user interface, an indication of the additional virtual vehicle.

11. A system for modeling vehicle operating behavior in a virtual environment, comprising: a user interface; a memory storing (i) a data model indicative of vehicle operating behavior previously conducted by an operator of a vehicle, and (ii) a set of computer-executable instructions; and a processor communicatively coupled to the user interface and the memory, and configured to execute the computer-executable instructions to cause the processor to: access the data model from the memory, initiate, in the virtual environment, a virtual trip of a virtual vehicle operated by a virtual operator, and conduct the virtual trip, including: determine, based at least in part on the data model, a set of virtual vehicle movements for the virtual vehicle to undertake in the virtual trip, and cause the user interface to display visual data indicative of the set of virtual vehicle movements for review by the operator of the vehicle.

12. The system of claim 11, further comprising: a set of sensors configured to generate a set of vehicle operation data associated with current operation of the vehicle by the operator; where the processor is further configured to: access the set of vehicle operation data from the set of sensors, and update the data model based on at least a portion of the set of vehicle operation data, wherein the memory stores the data model that was updated.

13. The system of claim 12, wherein to conduct the virtual trip, the processor is further configured to: determine, based at least in part on the data model that was updated, an additional set of virtual vehicle movements for the virtual vehicle to undertake in the virtual trip, and cause the user interface to display additional visual data indicative of the additional set of virtual vehicle movements for review by the operator of the vehicle.

14. The system of claim 12, wherein to determine, based at least in part on the data model, the set of virtual vehicle movements for the virtual vehicle to undertake in the virtual trip, the processor is configured to: determine, based at least in part on the data model that was updated, the set of virtual vehicle movements for the virtual vehicle to undertake in the virtual trip.

15. The system of any one of claims 11 to 14, wherein to initiate, in the virtual environment, the virtual trip of the virtual vehicle operated by the virtual operator, the processor is configured to: cause the user interface to display (i) a virtual map, and (ii) an indication of the virtual vehicle located on the virtual map.

16. The system of any one of claims 11 to 15, wherein to determine, based at least in part on the data model, the set of virtual vehicle movements for the virtual vehicle to undertake in the virtual trip, the processor is configured to: initiate a virtual driving vignette as part of the virtual trip, and determine, based at least in part on the data model, the set of virtual vehicle movements for the virtual vehicle to undertake in the virtual driving vignette.

17. The system of any one of claims 11 to 16, wherein to determine, based at least in part on the data model, the set of virtual vehicle movements for the virtual vehicle to undertake in the virtual trip, the processor is configured to: determine, from the data model, a vehicle movement previously undertaken by the operator of the vehicle, and determine a virtual vehicle movement of the set of virtual vehicle movements that corresponds to the vehicle movement.

18. The system of any one of claims 11 to 17, wherein to cause the user interface to display the visual data indicative of the set of virtual vehicle movements for review by the operator of the vehicle, the processor is configured to: detect that the vehicle is stopped, and in response to detecting that the vehicle is stopped, cause the user interface to display the visual data indicative of the set of virtual vehicle movements for review by the operator of the vehicle.

19. The system of any one of claims 11 to 18, wherein the processor is further configured to: calculate, based at least in part on the set of virtual vehicle movements, a set of statistics for the virtual operator, and cause the user interface to display (i) an indication of the virtual operator, and (ii) the set of statistics.

20. The system of any one of claims 11 to 19, wherein the processor is further configured to: identify a contact of the operator of the vehicle, wherein an additional virtual vehicle having an additional virtual operator is associated with the contact, and cause the user interface to display an indication of the additional virtual vehicle.

Although the following text sets forth a detailed description of numerous different embodiments, it should be understood that the legal scope of the invention may be defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a non-transitory, machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that may be permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that may be temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it may be communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment, or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment.

As used herein, the terms "comprises," "comprising," "may include," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also may include the plural unless it is obvious that it is meant otherwise.

This detailed description is to be construed as examples and does not describe every possible embodiment, as describing every possible embodiment would be impractical, if not impossible. One could implement numerous alternate embodiments, using either current technology or technology developed after the filing date of this application.

The patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed is:

1. A computer-implemented method of modeling a vehicle in a virtual environment, the method comprising:

accessing, from a memory, a data model indicative of vehicle operating behavior previously conducted by an operator of the vehicle, the data model comprising one or more operation characteristics including at least one selected from a group consisting of braking, acceleration, and steering;

accessing a set of vehicle operation data associated with operation of the vehicle by the operator collected by one or more sensors;

updating the one or more operation characteristics in the data model based upon the set of vehicle operation data;

initiating, by a processor in the virtual environment, a virtual trip of a virtual vehicle operated by a virtual operator; and conducting, by the processor, the virtual trip, including:

determining, based at least in part on the one or more updated operation characteristics in the data model, a set of virtual vehicle movements simulating a performance level of at least one of the one or more updated operation characteristics for the virtual vehicle to undertake in the virtual trip, and displaying, in a user interface, visual data indicative of the set of virtual vehicle movements.

2. The computer-implemented method of claim 1, wherein conducting the virtual trip further includes:
- determining, based at least in part on the one or more updated operation characteristics in the data model, an additional set of virtual vehicle movements for the virtual vehicle to undertake in the virtual trip, and
- displaying, in the user interface, additional visual data indicative of the additional set of virtual vehicle movements.

3. The computer-implemented method of claim 1, wherein determining, based at least in part on the one or more updated operation characteristics in the data model, the set of virtual vehicle movements for the virtual vehicle to undertake in the virtual trip comprises:
- determining, based at least in part on the one or more updated operation characteristics in the data model, the set of virtual vehicle movements for the virtual vehicle to undertake in the virtual trip.

4. The computer-implemented method of claim 1, wherein initiating, in the virtual environment, the virtual trip of the virtual vehicle operated by the virtual operator comprises:
- displaying, in the user interface, (i) a virtual map, and (ii) an indication of the virtual vehicle located on the virtual map.

5. The computer-implemented method of claim 1, wherein determining, based at least in part on the one or more updated operation characteristics in the data model, the set of virtual vehicle movements for the virtual vehicle to undertake in the virtual trip comprises:
- initiating a virtual driving vignette as part of the virtual trip, and
- determining, based at least in part on the one or more updated operation characteristics in the data model, the set of virtual vehicle movements for the virtual vehicle to undertake in the virtual driving vignette.

6. The computer-implemented method of claim 1, wherein determining, based at least in part on the one or more updated operation characteristics in the data model, the set of virtual vehicle movements for the virtual vehicle to undertake in the virtual trip comprises:
- determining, from the data model, a vehicle movement previously undertaken by the operator of the vehicle, and
- determining a virtual vehicle movement of the set of virtual vehicle movements that corresponds to the vehicle movement.

7. The computer-implemented method of claim 1, wherein displaying, in the user interface, the visual data indicative of the set of virtual vehicle movements comprises:
- detecting that the vehicle is stopped, and
- in response to detecting that the vehicle is stopped, displaying, in the user interface, the visual data indicative of the set of virtual vehicle movements.

8. The computer-implemented method of claim 1, further comprising:
- calculating, based at least in part on the set of virtual vehicle movements, a set of statistics for the virtual operator; and
- displaying, in the user interface, (i) an indication of the virtual operator, and (ii) the set of statistics.

9. The computer-implemented method of claim 1, further comprising:
- identifying a contact of the operator of the vehicle, wherein an additional virtual vehicle having an additional virtual operator is associated with the contact; and
- displaying, in the user interface, an indication of the additional virtual vehicle.

10. A system for modeling a vehicle in a virtual environment, comprising:
- a user interface;
- a memory storing (i) a data model indicative of vehicle operating behavior previously conducted by an operator of the vehicle, and (ii) a set of computer-executable instructions, the data model comprising one or more operation characteristics including at least one selected from a group consisting of braking, acceleration, and steering; and
- a processor communicatively coupled to the user interface and the memory, and configured to execute the computer-executable instructions to cause the processor to:
  - access the data model from the memory,
  - access a set of vehicle operation data associated with operation of the vehicle by the operator collected by a set of sensors,
  - update the one or more operation characteristics in the data model based upon the set of vehicle operation data,
  - initiate, in the virtual environment, a virtual trip of a virtual vehicle operated by a virtual operator, and
  - conduct the virtual trip, including:
    - determine, based at least in part on the one or more updated operation characteristics in the data model, a set of virtual vehicle movements simulating a performance level of at least one of the one or more updated operation characteristics for the virtual vehicle to undertake in the virtual trip, and
    - cause the user interface to display visual data indicative of the set of virtual vehicle movements.

11. The system of claim 10, further comprising:
- the set of sensors configured to generate the set of vehicle operation data associated with the operation of the vehicle by the operator.

12. The system of claim 11, wherein to conduct the virtual trip, the processor is further configured to:
- determine, based at least in part on the data model, an additional set of virtual vehicle movements for the virtual vehicle to undertake in the virtual trip, and
- cause the user interface to display additional visual data indicative of the additional set of virtual vehicle movements.

13. The system of claim 11, wherein to determine, based at least in part on the one or more updated operation characteristics in the data model, the set of virtual vehicle movements for the virtual vehicle to undertake in the virtual trip, the processor is configured to:
- determine, based at least in part on the one or more updated operation characteristics in the data model, the set of virtual vehicle movements for the virtual vehicle to undertake in the virtual trip.

14. The system of claim 10, wherein to initiate, in the virtual environment, the virtual trip of the virtual vehicle operated by the virtual operator, the processor is configured to:
- cause the user interface to display (i) a virtual map, and (ii) an indication of the virtual vehicle located on the virtual map.

15. The system of claim 10, wherein to determine, based at least in part on the one or more updated operation characteristics in the data model, the set of virtual vehicle movements for the virtual vehicle to undertake in the virtual trip, the processor is configured to:

initiate a virtual driving vignette as part of the virtual trip, and determine, based at least in part on the one or more updated operation characteristics in the data model, the set of virtual vehicle movements for the virtual vehicle to undertake in the virtual driving vignette.

16. The system of claim 10, wherein to determine, based at least in part on the one or more updated operation characteristics in the data model, the set of virtual vehicle movements for the virtual vehicle to undertake in the virtual trip, the processor is configured to:

determine, from the data model, a vehicle movement previously undertaken by the operator of the vehicle, and determine a virtual vehicle movement of the set of virtual vehicle movements that corresponds to the vehicle movement.

17. The system of claim 10, wherein to cause the user interface to display the visual data indicative of the set of virtual vehicle movements, the processor is configured to:

detect that the vehicle is stopped, and in response to detecting that the vehicle is stopped, cause the user interface to display the visual data indicative of the set of virtual vehicle movements.

18. The system of claim 10, wherein the processor is further configured to:

calculate, based at least in part on the set of virtual vehicle movements, a set of statistics for the virtual operator, and cause the user interface to display (i) an indication of the virtual operator, and (ii) the set of statistics.

19. The system of claim 10, wherein the processor is further configured to:

identify a contact of the operator of the vehicle, wherein an additional virtual vehicle having an additional virtual operator is associated with the contact, and cause the user interface to display an indication of the additional virtual vehicle.

* * * * *